(12) United States Patent
Komobuchi et al.

(10) Patent No.: US 6,548,879 B2
(45) Date of Patent: Apr. 15, 2003

(54) SEMICONDUCTOR DEVICE HAVING HEAT DETECTING ELEMENT AND INSULATING CAVITY AND METHOD OF MANUFACTURING THE SAME

(76) Inventors: Hiroyoshi Komobuchi, 1-1-411, Matsudaira-Chikuzen, Momoyama-cho, Fushimi-ku, Kyoto-shi, Kyoto (JP), 612-8031; Yoshikazu Chatani, 8, Kamoto-cho, Misasagi, Yamashina-ku, Kyoto-shi, Kyoto (JP), 607-8432; Takahiro Yamada, 3-31-26, Taguchiyama, Hirakata-shi, Osaka (JP), 573-0001; Rieko Nishio, 5-19, Yamanohana-cho, Shugakuin, Sakyo-ku, Kyoto-shi, Kyoto (JP), 606-8025; Hiroaki Uozumi, 10-18, Sannotsubo, Terado-cho, Mukou-shi, Kyoto (JP), 617-0002; Masayuki Masuyama, 2-5-20, Kugai, Nagaokakyo-shi, Kyoto (JP), 617-0837; Takumi Yamaguchi, 5-1-409, Yamanouchi-Yourou-cho, Ukyo-ku, Kyoto-shi, Kyoto (JP), 615-0081

(*) Notice: Subject to any disclaimer, the term of this patent is extended or adjusted under 35 U.S.C. 154(b) by 0 days.

(21) Appl. No.: 09/896,810

(22) Filed: Jun. 29, 2001

(65) Prior Publication Data

US 2002/0055203 A1 May 9, 2002

Related U.S. Application Data

(63) Continuation of application No. PCT/JP00/07657, filed on Oct. 31, 2000.

(30) Foreign Application Priority Data

Nov. 1, 1999 (JP) .............................. 11-310553
Nov. 19, 1999 (JP) .............................. 11-329516

(51) Int. Cl.[7] .......................... H01L 27/14; H01L 31/00
(52) U.S. Cl. ...................... 257/431; 257/227; 257/467; 257/469; 250/332; 250/338.1
(58) Field of Search ................................. 257/467, 469, 257/227, 431; 250/332, 338.1

(56) References Cited

U.S. PATENT DOCUMENTS

| 5,426,412 A | * | 6/1995 | Tomonari et al. ......... 250/338.1 |
| 5,689,087 A | * | 11/1997 | Jack ........................... 136/213 |
| 5,698,852 A | * | 12/1997 | Tanaka et al. .............. 250/332 |
| 5,852,321 A | | 12/1998 | Tohyama ..................... 257/443 |
| 6,163,061 A | * | 12/2000 | Iida ............................. 257/414 |
| 6,294,787 B1 | * | 9/2001 | Schieferdecker et al. ..................... 250/339.09 |

FOREIGN PATENT DOCUMENTS

| JP | 7-134066 | 5/1995 |
| JP | 7-283444 | 10/1995 |
| JP | 9-145479 | 6/1997 |
| JP | 9-246508 | 9/1997 |
| JP | 9-2662202 | 10/1997 |
| JP | 10-19666 | 1/1998 |
| JP | 11-132860 | 5/1999 |
| JP | 11-337403 | 12/1999 |
| JP | 11-344375 | 12/1999 |

* cited by examiner

*Primary Examiner*—David Nelms
*Assistant Examiner*—Tu-Tu Ho
(74) *Attorney, Agent, or Firm*—Merchant & Gould P.C.

(57) ABSTRACT

The present invention provides a semiconductor device including a silicon substrate; a heat insulating layer including a silicon oxide film; and a heat detecting portion, in which the heat insulating layer includes a closed cavity and/or a hole, an interior of the hole has a greater diameter than an opening of the hole, and at least a portion of the closed cavity or the hole is formed within the silicon oxide film. The invention also provides a method of manufacturing this semiconductor device.

21 Claims, 28 Drawing Sheets

SEMICONDUCTOR DEVICE HAVING HEAT DETECTING ELEMENT AND INSULATING CAVITY AND METHOD OF MANUFACTURING THE SAME

This application is a continuation of international application number PCT/JP00/07657, filed Oct. 31, 2000, pending (published in Japanese).

BACKGROUND OF THE INVENTION

1. Field of the Invention

The present invention relates to a semiconductor device and a method of manufacturing the same. More particularly, the present invention relates to a semiconductor device with a thermoelectric conversion function and discloses a technique suitable for a thermal image input device that is used for providing security or in the field of an ITS (Intelligent Transportation System).

2. Description of the Related Art

To conduct efficient heat detection, it is necessary to suppress heat radiation from a heat (infrared rays) detecting portion. For suppressing the heat radiation, a heat insulating layer containing a considerable amount of air is suitable. Conventionally, with the aim of providing such a heat insulating layer under the heat detecting portion, etching a silicon substrate so as to form a heat separation area having a hollow structure in the substrate has been proposed. (see JP 8(1996)-122162 A, for example). For etching the silicon substrate, an anisotropic etchant, e.g., an alkaline etchant such as KOH, hydrazine, or the like, has been used.

However, etching the silicon substrate takes a long time and thus prevents an improvement in productivity. In addition, it brings about a contamination problem and thus is not compatible with a mass production process of devices using a silicon semiconductor. Moreover, when the anisotropic etchant is used for etching, a (100) surface of the silicone is etched faster that a (111) surface of the silicon. Accordingly, when a silicon substrate of (100) surface orientation is used, respective side walls of the hollow portion make an angle of about 54° with the main surface, resulting in tapered side walls. To form the heat separation area under the heat detecting portion while providing allowance for such inclination of the side walls, an area larger than the heat detecting portion needs to be etched. An increase in an occupied area per element thus cannot be avoided, which makes a high-density arrangement of heat detecting portions (heat sensors) and on-tip consolidation with a visible light sensor difficult.

Especially in a heat sensor requiring a cold junction and a hot junction, for which a Seebeck type sensor is a typical example, it is desirable to increase a distance between the cold junction and the hot junction in order to improve the sensitivity of the sensor. However, as the distance between the junctions increases, the heat separation area with the tapered side walls occupies a still larger area on the surface of the substrate. Consequently, problems such as high manufacturing cost due to increases in size of an element and in diameter of an optical system become more significant.

SUMMARY OF THE INVENTION

Therefore, the present invention provides a semiconductor device allowing a high-density arrangement of heat detecting portions. The present invention also provides a method of manufacturing a semiconductor device allowing a high-density arrangement of heat detecting portions, which is highly compatible with a mass production process of devices using a silicon semiconductor.

In order to achieve the above, a semiconductor device according to the present invention includes a silicon substrate; a heat insulating layer including a silicon oxide film, which is formed on the silicon substrate; and a heat detecting portion formed on the heat insulating layer. The heat insulating layer includes a closed cavity and/or a hole, an interior of the hole has a greater diameter than an opening of the hole, and at least a portion of the closed cavity or the hole is formed within the silicon oxide film.

When used herein, the term "closed cavity" means a closed space that has no opening extending to the surface of the heat insulating layer and thus is isolated from outside air above the surface of the heat insulating layer. On the other hand, the term "hole" means a recess with an opening extending to the surface of the heat insulating layer.

In the above-mentioned semiconductor device, the heat insulating layer including the closed cavity and/or the hole exhibits excellent heat insulating properties. Further, the above-mentioned hole is advantageous in achieving high-density arrangement of heat detecting portions because the hole is widened in its interior but not in its opening positioned in the vicinity of the surface of the heat insulating layer. Further, forming the closed cavity is still more advantageous in achieving the high-density arrangement of heat detecting portions because it allows the utilization of the entire surface of the heat insulating layer.

Further, a method of manufacturing a semiconductor device according to the present invention includes the acts of: forming a silicon oxide film on a silicon substrate; forming a silicon polycrystalline film on the silicon oxide film as at least a portion of a heat insulating layer; forming a hole extending through the silicon oxide film and a silicon polycrystalline film by dry etching, the hole having an opening and an interior; oxidizing at least a portion of the silicon polycrystalline film that is in contact with an opening of the hole so that the opening is closed or a diameter of the opening is made smaller than that of an interior of the hole; and forming a heat detecting portion on a heat insulating layer.

According to this manufacturing method, the above-mentioned semiconductor device can be manufactured only by acts that are highly compatible with a so-called silicon mass production process, without using an alkaline etchant such as KOH, hydrazine, or the like.

DETAILED DESCRIPTION OF THE INVENTION

Figure 1:
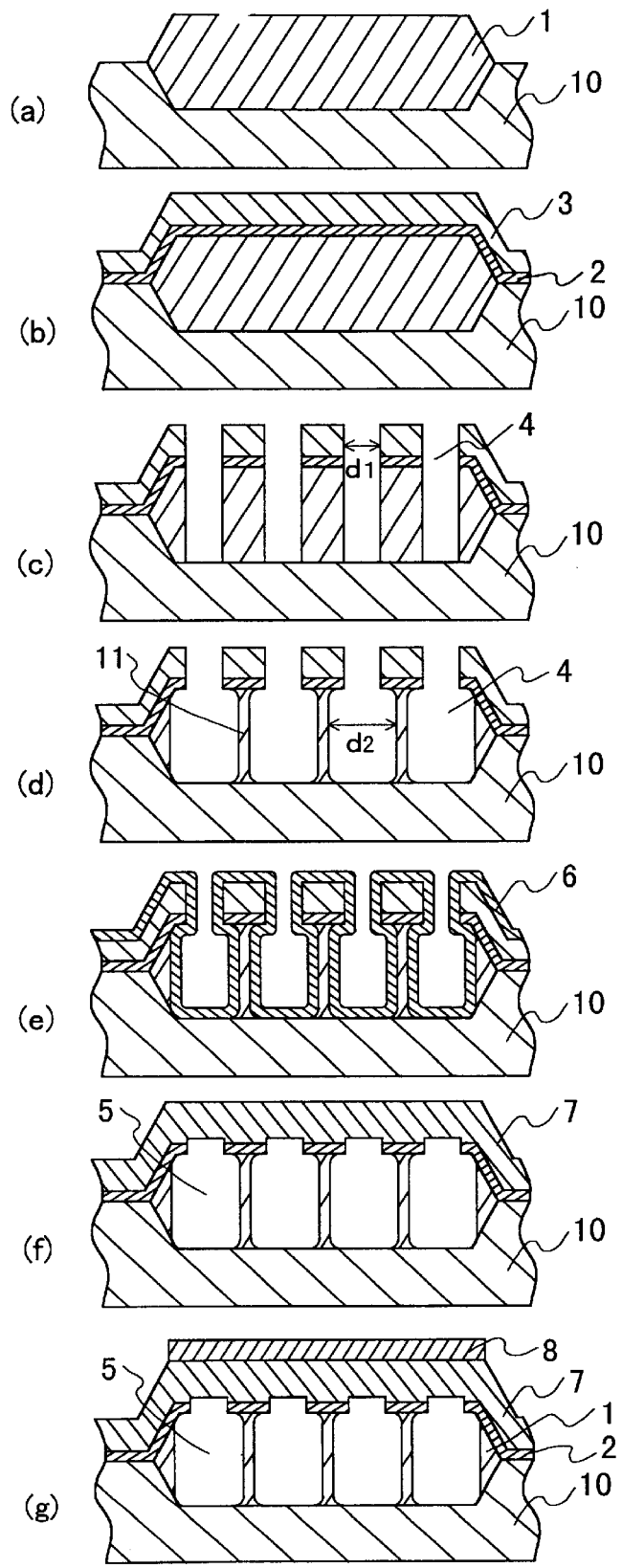
FIG. 1 is a process drawing illustrating an example of a manufacturing method according to the present invention.

As described above, in the embodiment of the present invention, a closed cavity is included in a heat insulating layer. This heat insulating layer includes at least a silicon oxide film. This silicon oxide film is partially removed to form at least a portion of the closed cavity (or a hole).

In a typical embodiment of the present invention, the heat insulating layer includes a partially oxidized silicon polycrystalline film arranged above the closed cavity. In the case where the heat insulating layer includes a hole, the layer includes a partially oxidized silicon polycrystalline film, the oxidized portion of the silicon polycrystalline film surrounding the opening of the hole. The closed cavity or hole in a semiconductor device can be formed by a method involving partial oxidization of the silicon polycrystalline film. When formed by this method, the closed cavity or the hole whose interior has been expanded contains the silicon polycrystalline film as described above. A film formed as a silicon polycrystalline film may be oxidized substantially entirely so that the film ultimately turns to a silicone oxide film. In this case, another silicon oxide film (an additional silicon oxide film) is present above the closed cavity (alternatively, the film is present so as to surround the opening of the hole).

The heat insulating layer preferably includes a silicon nitride film formed on the silicon oxide film. The silicon nitride film has a high strength and thus is suitable for maintaining a strength of the layer including the hole and/or closed cavity. In the case where the closed cavity is formed, the silicon nitride film has an opening, for example, above the closed cavity. On the other hand, in the case where the hole is formed, an opening of the hole, for example, extends through the silicon nitride film. In a typical embodiment of the present invention, the opening is formed by applying dry etching. On the silicon nitride film, another partially oxidized silicon polycrystalline film may be formed. Further, by forming the silicon nitride film between the silicon polycrystalline film and the closed cavity or the expanded interior of the hole, a structure in which the silicon polycrystalline film is supported by the silicon nitride film above the closed cavity or the like can be realized. This structure is advantageous from the viewpoint of strength. In this case also, the partially oxidized silicon polycrystalline film may be oxidized entirely to be a silicon oxide film.

The semiconductor device according to the present invention may further include an intermediate layer formed of at least one selected from an organic material and a porous material between the heat insulating layer and the heat detecting portion. The intermediate film improves heat insulating properties of the semiconductor device. Further, it is preferable that a heat detecting portion is formed of a material having at least one selected from a bolometer effect and Seebeck effect.

In the semiconductor device according to the present invention, a diameter of the closed cavity or the hole at the portion within the silicon oxide film is preferably between 10 nm and 1 $\mu$m in the thickness direction of the heat insulating layer. If the diameter is too small, sufficient heat insulating properties may not be obtained. On the other hand, a heat insulating layer with a greater diameter than is needed does not serve to improve the heat insulating properties greatly. Conversely, such a layer may bring about a problem such as a degraded efficiency in manufacturing the semiconductor device. Further, a diameter of the closed cavity or the hole at the portion within the silicon oxide film is suitably between 0.3 $\mu$m and 0.8 $\mu$m in the in-plane direction of the heat insulating layer. In a typical embodiment of the present invention, a diameter of the closed cavity or the opening at the portion within the silicon oxide film is a maximum diameter in the in-plane direction of the heat insulating layer.

A semiconductor device used for detecting infrared rays is usually used while being enclosed in a vacuum package. In this case, heat radiation due to convection is of no significance.

The heat insulating layer preferably includes a plurality of closed cavities and holes. These closed cavities and holes may be present independently or linked with each other in the heat insulating layer. Further, by arranging the plurality of closed cavities or holes in a predetermined pattern and then forming a heat detecting portion along this pattern, a heat insulating effect can be obtained efficiently. The closed cavities or the like may be connected with each other in the heat insulating layer.

The above-mentioned semiconductor device can be utilized, for example, as a solid-state image pickup device. In this applicable field, a plurality of heat insulating layers and heat detecting portions are arranged in rows and columns (i.e., in matrix) and a laminated structure of the heat insulating layers and heat detecting portions forms a matrix with the predetermined number of rows and columns. In this case, it is preferable that a light detecting portion is arranged adjacent to each heat detecting portion. In this preferable example, images can be formed utilizing a thermoelectric conversion function of the heat detecting portions and a photoelectric conversion function of the light detecting portions. Basically, the above-mentioned semiconductor device requires no extra area (dead space) for forming the heat insulating layer. An area for arranging photoelectric conversion portions thus can be easily secured.

In the above-mentioned solid-state image pickup device, first, signals from respective heat detecting portions arranged in rows and columns (i.e., in matrix) are vertically transmitted along the columns of the heat detecting portions. As a signal vertical transmission means for conducting such transmission, a charge coupled device (CCD) is used in a solid-state image pickup device of a so-called CCD type. However, the solid-state image pickup device may be of a so-called MOS type, which employs a read-out structure using a complementary MOS (C-MOS) as a signal vertical transmission means.

In the above-mentioned semiconductor device, with respect to each heat detecting portion, a charge storage portion and a charge read-out portion for reading out a charge in the charge storage portion in accordance with an electric signal generated from the heat-detecting portion are preferably provided. By using the charge storage portion, a stable signal output free from the influence of voltage variation and the like can be easily obtained. This charge storage portion is preferably arranged in an area adjacent to the heat detecting portion, for example, as a capacitative element. The above-mentioned semiconductor device, which requires no extra area for forming the heat detecting portions, is also advantageous in securing an area for forming the charge storage portions.

In a method of manufacturing a semiconductor device according to the present invention, an opening of the hole is at least made smaller by the oxidization of the silicon polycrystalline film. The opening of the hole may be closed by continuing the oxidization of the silicon polycrystalline film. In this case, a portion of the hole formed by dry etching remains in the heat insulating layer as a closed cavity.

Further, after the hole has been formed, the act of retreating internal walls in contact with the hole of the silicon oxide film by wet etching may be performed so that a diameter of an interior of the hole is made greater than that of the opening of the hole. With this act, the difference in diameter between the interior and the opening is increased. This wet etching can be performed using a liquid applicable to a normal silicon mass production process. Examples of such a liquid include a buffered hydrofluoric acid.

Further, the act of adhering an additional silicon polycrystalline film at least to the internal walls in contact with the opening of the hole may be performed. With this act, the opening of the hole can be made smaller or closed efficiently and reliably. More specifically, after the silicon polycrystalline film has been formed, the act of adhering an additional silicon polycrystalline film at least to the internal walls in contact with the opening of the hole and subsequently oxidizing at least an adhered portion to the internal walls of the additional silicon polycrystalline film may be performed at least once to close the opening of the hole.

It is suitable that the hole is formed by dry etching so as to have a diameter of 0.3 $\mu$m to 0.4 $\mu$m. Further, taking the above-mentioned suitable diameter into consideration, it is suitable that the silicon oxide film is formed so as to have a thickness of 10 nm to 1 $\mu$m.

In the case where a silicon nitride film is formed, the silicon nitride film can be formed by performing the act of forming this film on the silicon oxide film before forming the silicon polycrystalline film. Further, the act of forming an intermediate layer that is formed of at least one selected from an organic material and a porous material on the silicon polycrystalline film may be performed after oxidizing the silicon polycrystalline film and before forming the heat detecting portion.

In the above-mentioned method of manufacturing a semiconductor device, it is preferable that a plurality of holes are formed by dry etching. In this case, the act of removing at least a portion of the internal walls formed of the silicon oxide film between the holes by wet etching so that the holes are linked with each other may be further performed. Further, the plurality of holes may be formed in a predetermined pattern and a heat detecting portion may be formed along this pattern. Furthermore, a plurality of heat insulating layers and heat detecting portions may be formed in rows and columns on the silicon substrate. In the case where the plurality of holes are formed by dry etching, some of the holes may remain as closed cavities and others may remain as holes ultimately. Like this, the above-mentioned semiconductor device may include both the closed cavities and the holes.

Hereinafter, the present invention will be more specifically described with reference to the accompanying drawings.

FIG. 1 illustrates an example of a method of manufacturing a semiconductor device according to the present invention.

First, a silicon oxide film (LOCOS) 1 is formed selectively on the surface of a silicon substrate 10 by thermal oxidization (FIG. 1(a)). Then, on the silicon oxide film 1, a silicon nitride film 2 and a silicon polycrystalline film 3 are formed in this order (FIG. 1(b)). The silicon nitride film and the silicon polycrystalline film may be formed, for example, by low pressure CVD.

In a predetermined area on the surface of the silicon polycrystalline film 3, holes 4 are formed by dry etching (FIG. 1(c)). The holes 4 are formed so as to extend through at least the silicon nitride film 2 and the silicon polycrystalline film 3. As shown in the drawing, it is preferable that the holes have an enough depth to reach the interface of the silicon oxide film 1 and the silicon substrate 10. The etching may be continued until recesses are formed on the surface of the silicon substrate 10.

Subsequently, interiors of the holes 4 are expanded by wet etching (FIG. 1(d)). For this wet etching, for example, a buffered hydrofluoric acid can be used. If the wet etching is performed using the buffered hydrofluoric acid, a selection ratio of the silicon oxide film to the silicon polycrystalline film and silicon nitride film is made sufficiently high. A lower portion of each inner wall of the holes, which is formed of the silicon oxide film, thus retreats greatly. After this side etching has been performed, each of the holes 4 gives the cross-sectional shape with its interior being wider than its opening, as shown in the drawing. Taking this shape as a bottle, the opening of the hole corresponds to a neck portion of the bottle. The neck portion is usually present above the silicon oxide film 1.

The inner wall retreating width of the holes through the side etching can be represented by ½ of the difference between a diameter $d_2$ of the interior of the hole and a diameter $d_1$ of the opening of the hole. In the case where a sufficient difference in diameter cannot be obtained after the wet etching has been performed once, the wet etching may be performed repeatedly. In the side etching performed using a generally utilized buffered hydrofluoric acid of about 20:1, the inner wall retreating width $((d_2-d_1)/2)$ is not more than about 0.2 $\mu$m. In the method as illustrated in the drawing, partition walls 11 of the silicon oxide film remains between the holes 4. However, the holes can be linked with each other by wet etching by decreasing the distance between the holes formed by dry etching.

Figure 3:
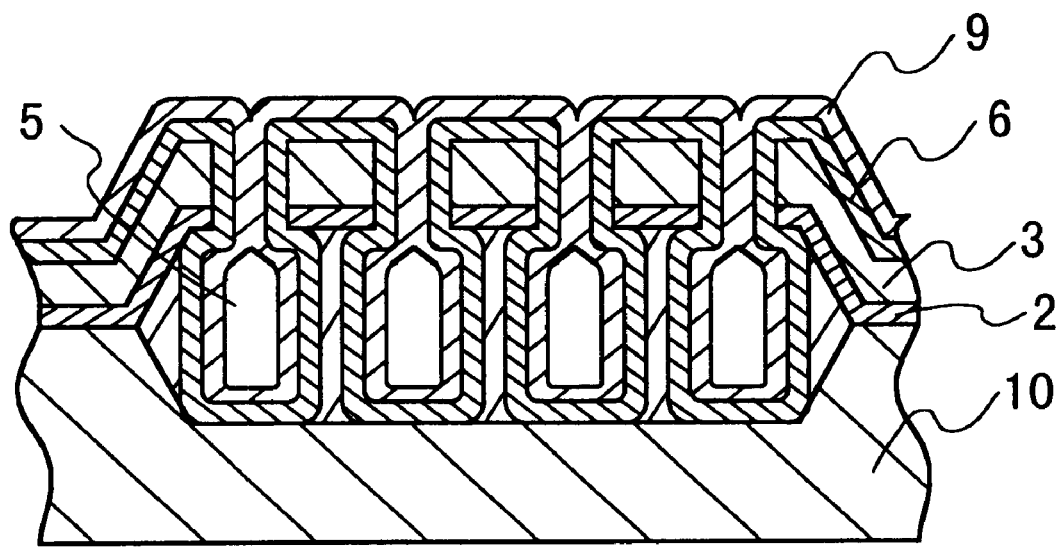
FIG. 3 is a cross-sectional view showing another example of a semiconductor device according to the present invention.

Then, a thin film 6 of silicon polycrystal is formed by low pressure CVD or the like (FIG. 1(e)). Subsequently, the silicon polycrystalline film is oxidized (FIG. 1(f)). The openings of the holes are closed by the oxidization of the silicon polycrystalline film, and the holes turn into closed cavities 5. Above the closed cavities, a shielding film 7 for shielding the closed cavities and the space is formed thereabove. Although FIG. 1(f) illustrates a state where the silicon polycrystalline film is oxidized entirely to be the shielding film, the shielding film may be an inhomogeneous silicon polycrystalline film whose surface is only partially oxidized. For example, as shown in FIG. 3, the shielding film is a silicon polycrystalline film 6 whose surface and some portions above the closed cavities have been partially oxidized to be a silicon oxide film 9. Sometimes, the silicon polycrystalline film that is not entirely oxidized remains in a silicon oxidize film in the closed cavities 5. In this case, as shown in FIG. 3, the silicon oxidize film including the closed cavities also includes a portion of the silicon polycrystalline film 6.

Then, a heat detecting portion 8 is formed on top of a heat insulating layer including the silicon oxide film with the closed cavities, the silicon nitride film, and the shielding film, which have been formed as above (FIG. 1(g)). This heat insulating structure is capable of sufficiently withstanding a post-process performed at a temperature of about 1000° C. Thus, a heat detecting material to be applied can be selected from a wide range. For example, vanadium oxides (VOx); bolometric materials such as titanium and the like; chromel-alumel thermocouples with a Seebeck effect; silicon polycrystalline substances; and the like can be used.

In the above-mentioned series of acts, the silicon nitride film 2 is not necessarily formed. However, it is preferable to form this film to ensure the strength of the film above the holes with an expanded interior or closed cavities. Similarly, the additional silicon polycrystalline film 6 is not necessarily formed. In the case where the additional film is not formed, at least the surface of the silicon polycrystalline film 3 is oxidized. However, to achieve rapid and reliable closing of the holes by oxidization, it is preferable to form the additional silicon polycrystalline film 6.

To realize the desirable heat insulating structure, the openings of the holes are preferably closed, but not necessarily closed completely. In this case, instead of the closed cavities 5, the holes whose opening has a smaller diameter than its interior remains in the insulating layer. Wet etching is not necessarily performed, but preferably performed to increase the difference in diameter between the interior and the opening. That is, after dry etching has been performed, oxidation for making the openings of the holes smaller may be conducted without performing wet etching.

It is appropriate that the hole formed by dry etching has a diameter $d_1$ of 0.3 $\mu$m to 0.4 $\mu$m. Accordingly, with consideration given to an appropriate width by which the diameter is expanded by the wet etching (up to 0.2 $\mu$m), a diameter $d_2$ of the hole, which is obtained after the hole has been expanded by wet etching is about 0.3 $\mu$m to 0.8 $\mu$m. Further, it is suitable that the silicon oxide film has a thickness in the range from 10 nm to 1 $\mu$m. The reason for this is that the diameter of the interior (except for the opening) of each hole or each closed cavity in the thickness direction of the insulating layer can be adjusted to be within the above-mentioned appropriate range.

In the method as described above, the heat insulating layer to be a heat separation area is formed by the method that is highly compatible with a general silicon mass production process. The holes or closed cavities included therein can be formed accurately at micrometer ($\mu$m) level. The heat insulating layer thus formed is capable of withstanding subsequent high temperature treatments.

Figure 2:
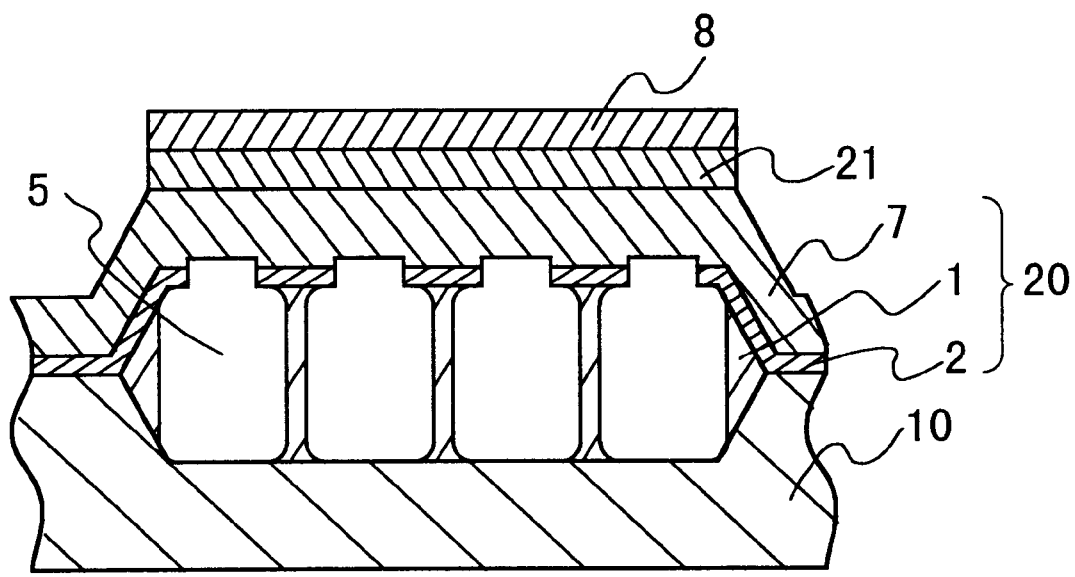
FIG. 2 is a cross-sectional view showing an example of a semiconductor device according to the present invention.

In the above-mentioned semiconductor device, an intermediate film 21 may lie between a heat insulating layer 20 and a heat detecting portion 8, as shown in FIG. 2. A material used as the intermediate film 21 is not specifically limited and can be, for example, a SOG film containing a SiH group such as polyimide, siloxane modified polyimide, siloxane, or the like; porous nanoform polyimide; an aerosil film; and the like. The material includes a so-called nanoform material that has been developed as a low dielectric material. In this case, the applied temperature in post-processes such as formation of the heat detecting portion and the like may be adjusted in a range of about 300° C. to 900° C. depending on the material used for the intermediate film.

The above-mentioned semiconductor device may further include another layer. The intermediate film may be a multilayer film. To further improve the heat insulating effect, a plurality of heat insulating layers including the holes and/or closed cavities may be laminated with each other via a shielding film.

Figure 4:
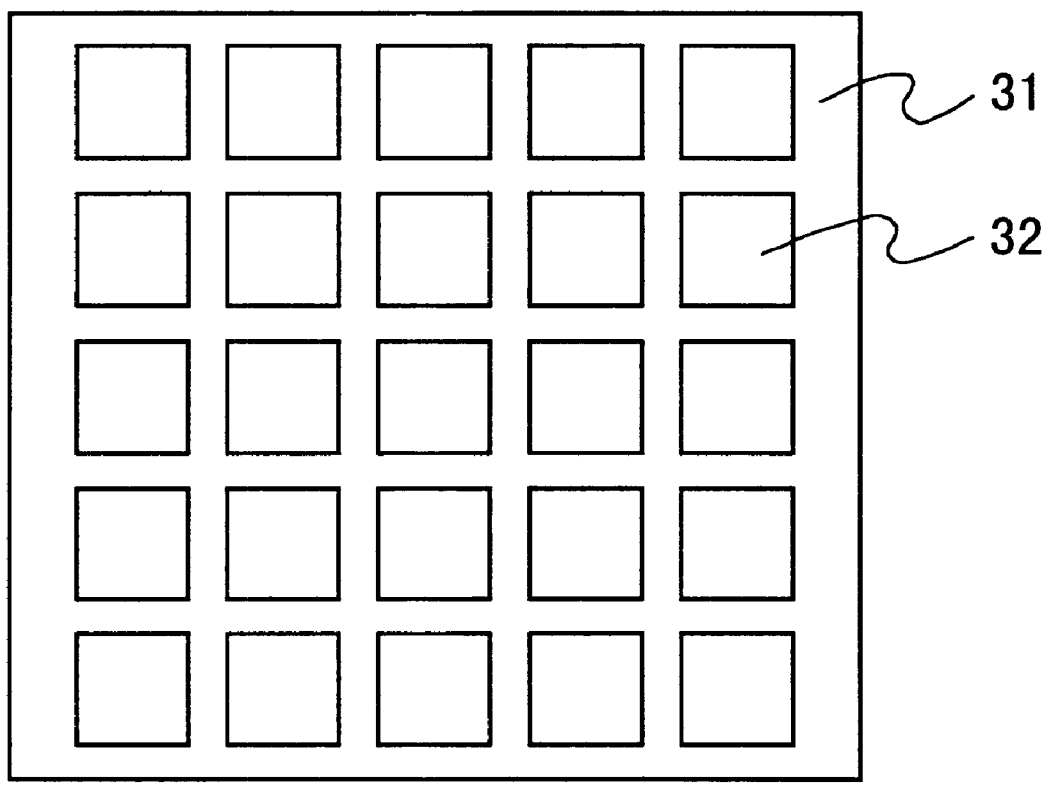
FIG. 4 is a plan view showing an example of a mask used for dry etching in a manufacturing method according to the present invention.
Figure 5:
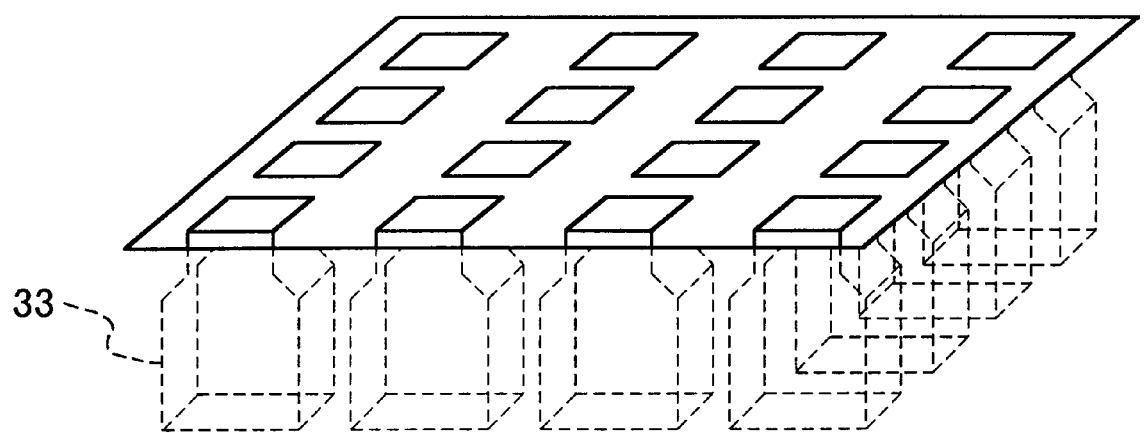
FIG. 5 is a perspective view illustrating an arrangement of holes in a semiconductor device manufactured using the mask shown in FIG. 4.
Figure 6:
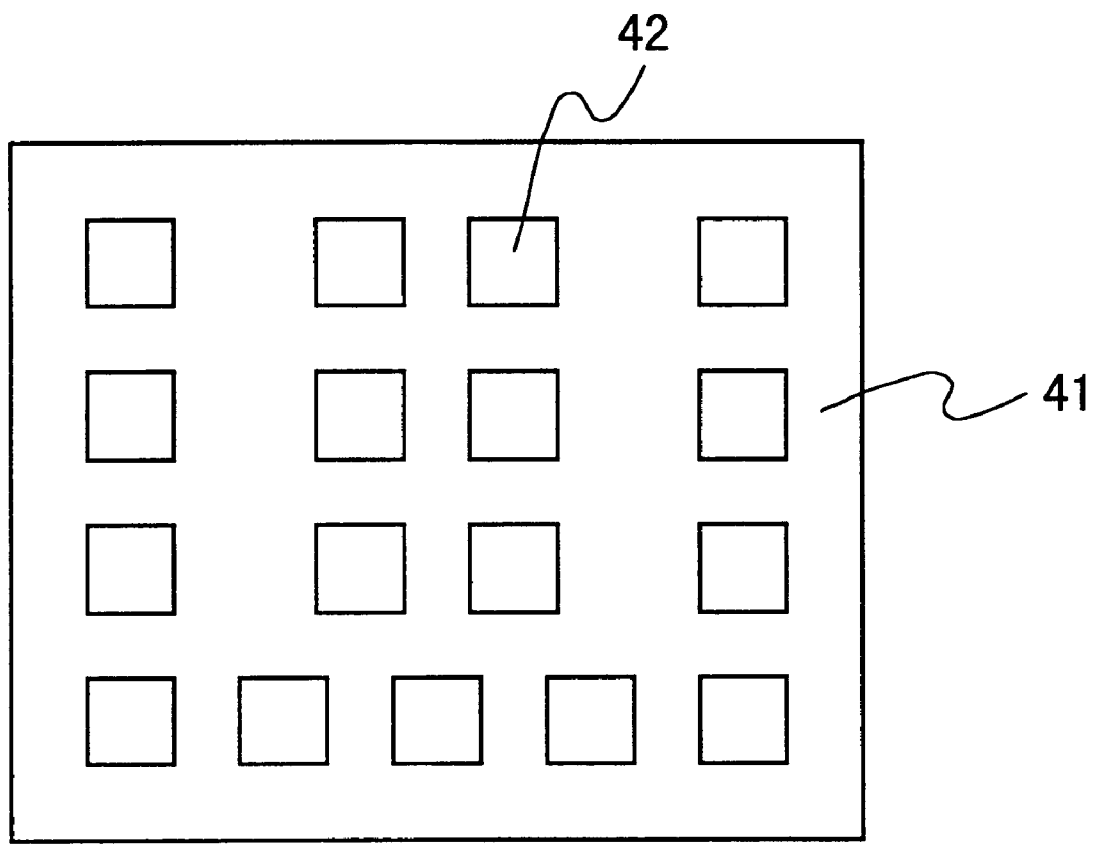
FIG. 6 is a plan view showing another example of a mask used for dry etching in a manufacturing method according to the present invention.

FIG. 4 shows an example of a mask used for the above-mentioned dry etching. With the use of this mask 31, holes are formed corresponding to openings 32 so as to be regularly arranged vertically and horizontally on the silicon oxide film. If wet etching is further applied to these holes, holes (or closed cavities) 33 as shown in FIG. 5 are formed. However, it is also possible to use a mask 41 with openings 42 arranged in a predetermined pattern, as shown in FIG. 6, for dry etching so that the holes or closed cavities are arranged in the predetermined pattern on the surface of the heat insulating layer. In this case, a pattern of the openings preferably coincides with a pattern of a heat detecting portion 44. If the regularly arranged holes are expanded simply, the heat insulating layer fails to maintain its strength in the course of time. However, if the heat detecting portion 44 is formed along the closed cavities 43 arranged in a predetermined pattern, heat can be insulated efficiently while maintaining the strength of the heat insulating layer.

Figure 7:
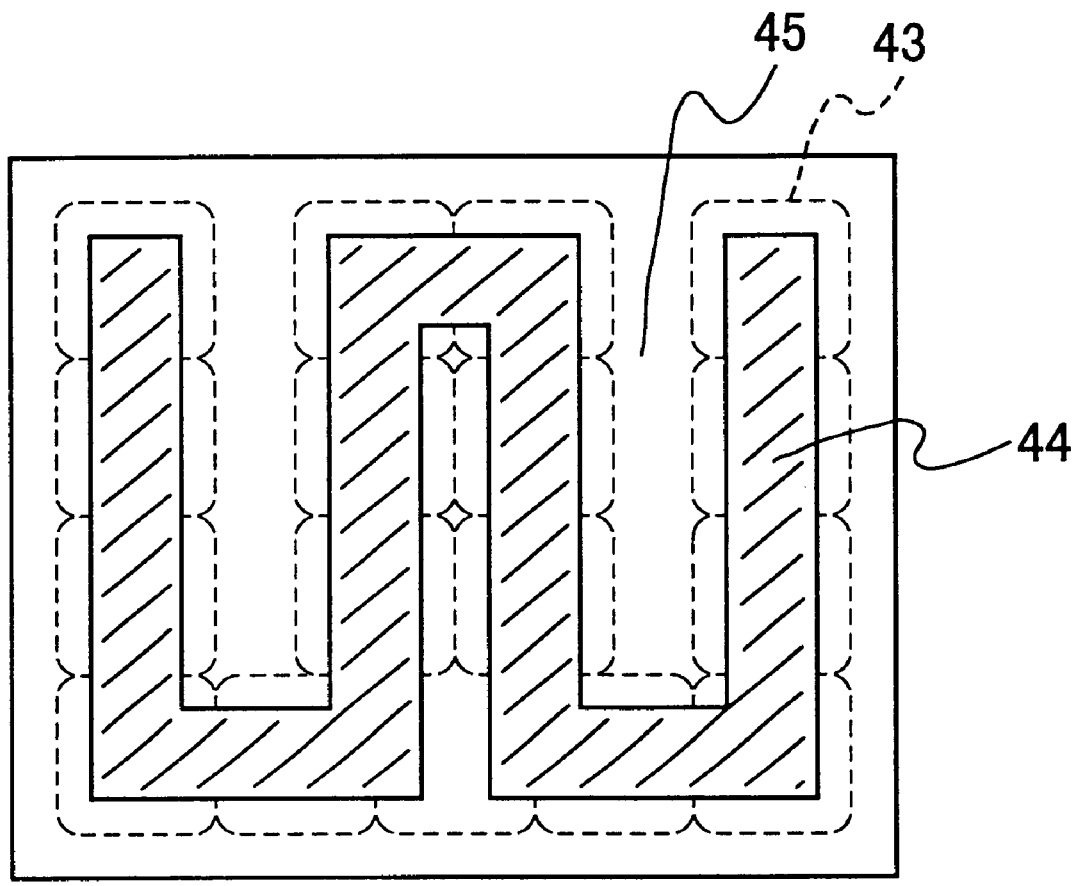
FIG. 7 is a plan view illustrating an arrangement of holes, along with an arrangement of a heat detecting portion, in a semiconductor device manufactured using the mask shown in FIG. 6.

In the embodiment shown in FIG. 7, the closed cavities are connected with each other inside the heat insulating layer along the heat detecting portion 44. The heat insulating layer supports the heat detecting portion 44 without collapsing with the aid of the partition walls around and between the closed cavities. By applying the above-mentioned manufacturing method, the holes or closed cavities can be formed in a predetermined area in the heat insulating layer, which allows the structure of the heat insulating layer to be designed appropriately. The heat detecting portion 44 is not specifically limited and can be formed by being folded so as to extend back and forth in a predetermined direction, typically as shown in the drawing, to secure a length in a small area.

Figure 8:
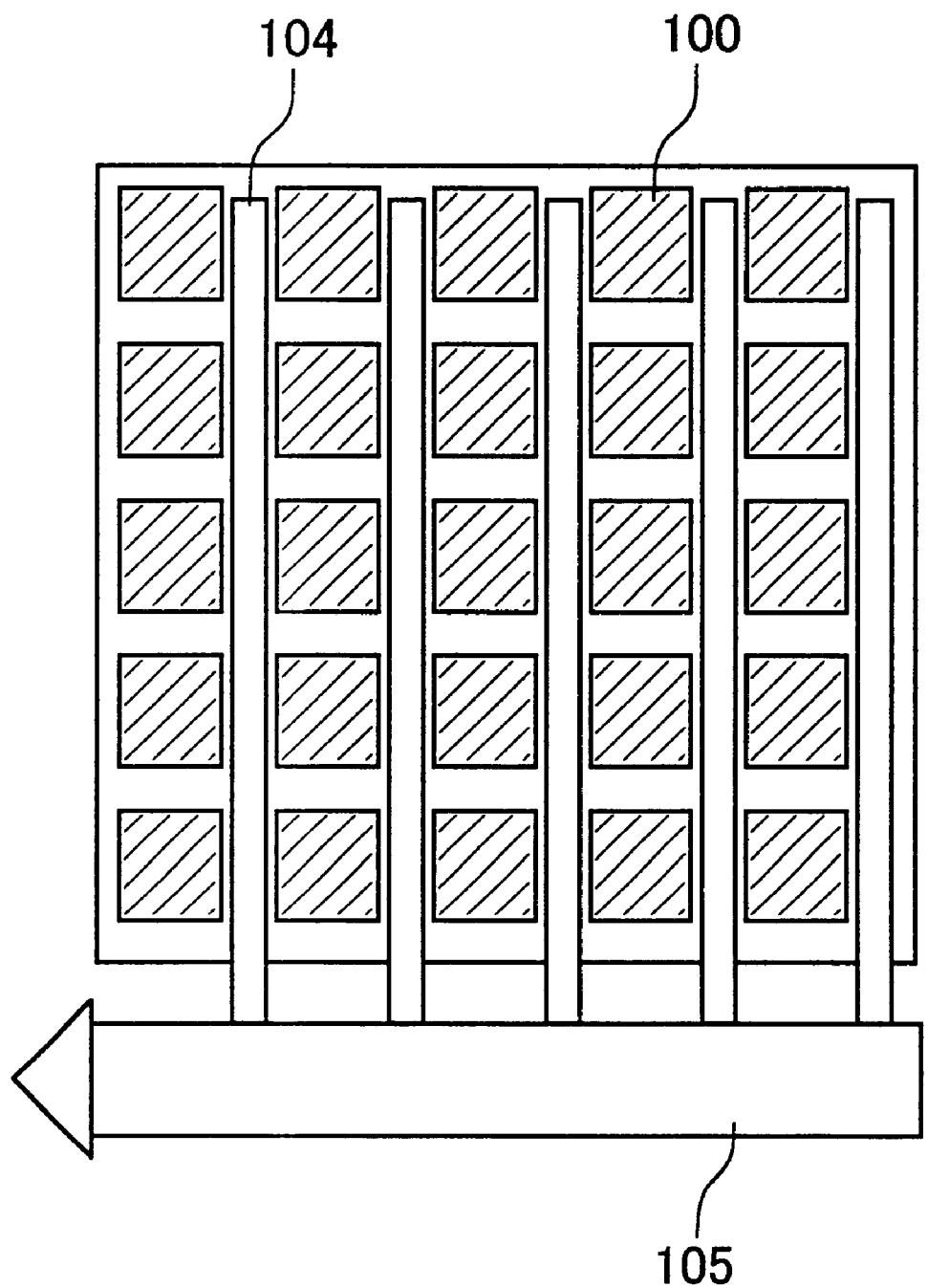
FIG. 8 is a plan view showing an example of a solid-state image pickup device adopting the present invention.
Figure 9:
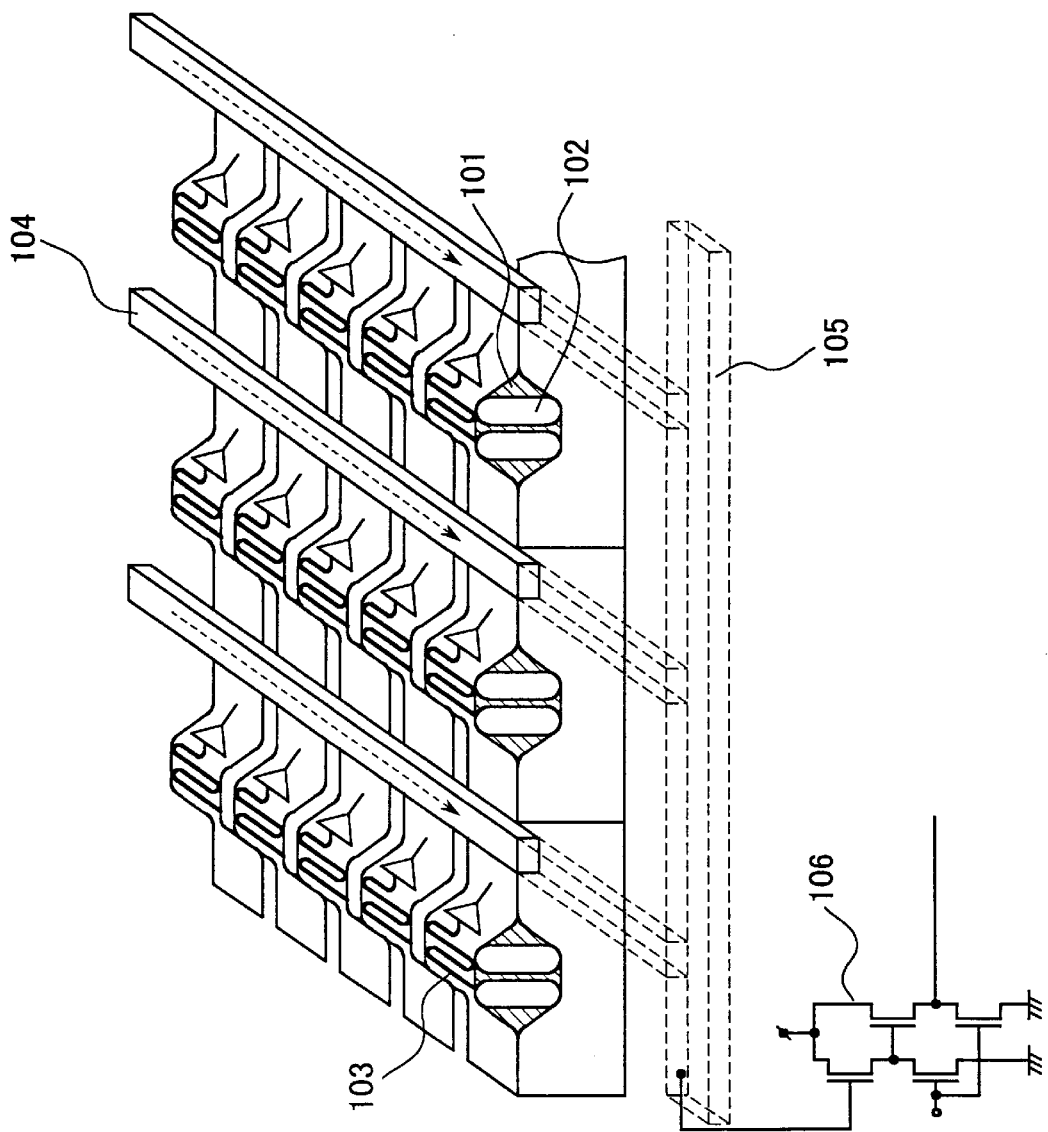
FIG. 9 is a partially cutaway perspective view of the solid-state image pickup device shown in FIG. 8.

The heat detecting portion (heat sensor) 44 with the above-mentioned heat insulating structure can be applied to a solid-state image pickup device with a thermal image displaying function. In this solid-state image pickup device, a predetermined number of pixels 100 each including a heat sensor are arranged in matrix in the directions of column and row, and signal vertical (direction) transmission means 104 are arranged between columns of the heat sensors, as shown in FIG. 8. Electric signals converted thermoelectrically by the heat sensors are transmitted from the signal vertical transmission means further to a horizontal (direction) signal transmission means 105. As shown in FIG. 9, a heat insulating layer 101 including a closed cavity 102 is arranged under each heat sensor 103. An electric signal from each pixel is read out to the outside via the signal vertical transmission means 104, the signal horizontal transmission means 105, and an output amplifier 106 in this order.

Figure 10:
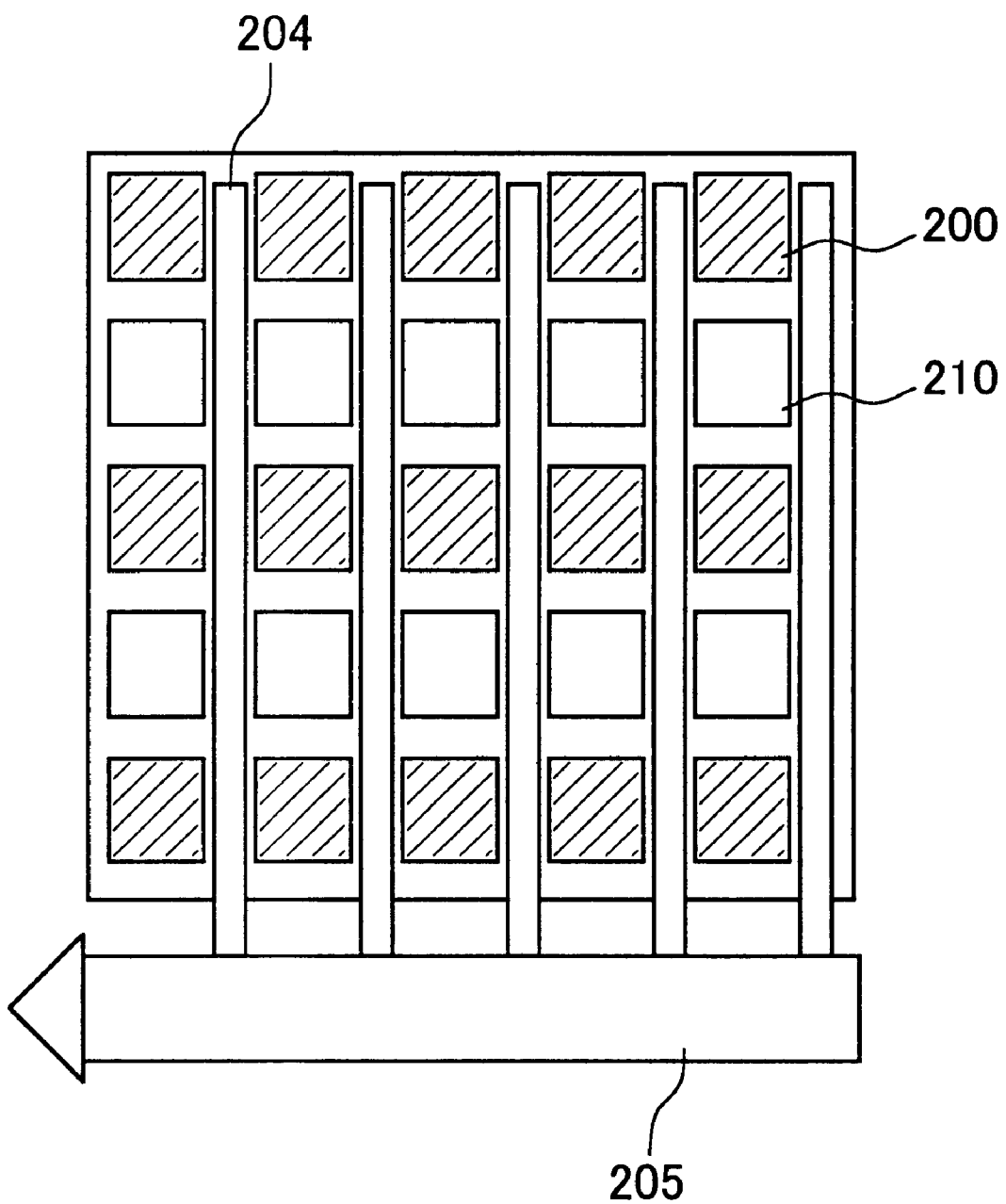
FIG. 10 is a plan view showing another example of a solid-state image pickup device adopting the present invention.
Figure 11:
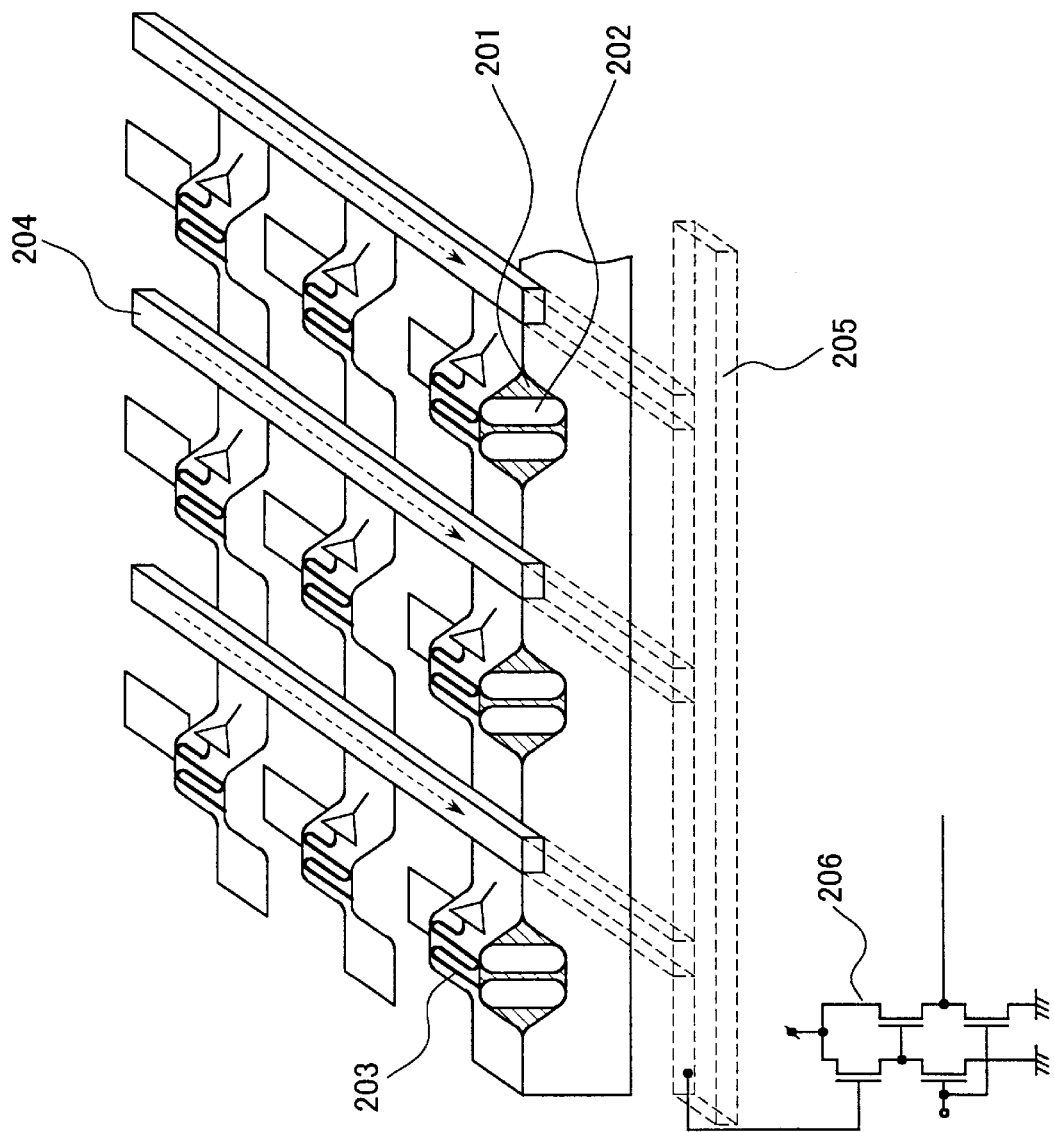
FIG. 11 is a partially cutaway perspective view of the solid-state image pickup device shown in FIG. 10.
Figure 12:
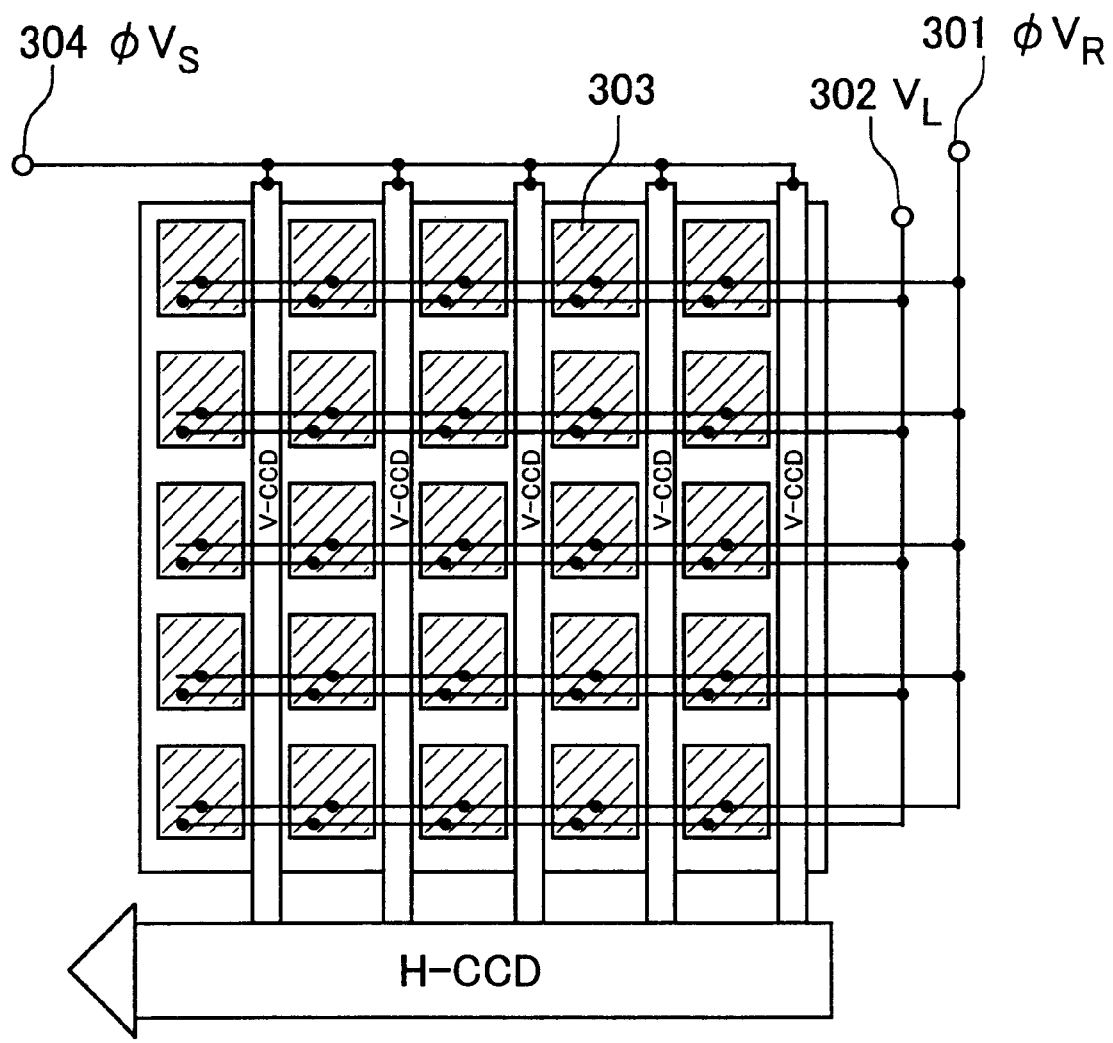
FIG. 12 is a plan view showing still another example of a solid-state image pickup device adopting the present invention.
Figure 13:
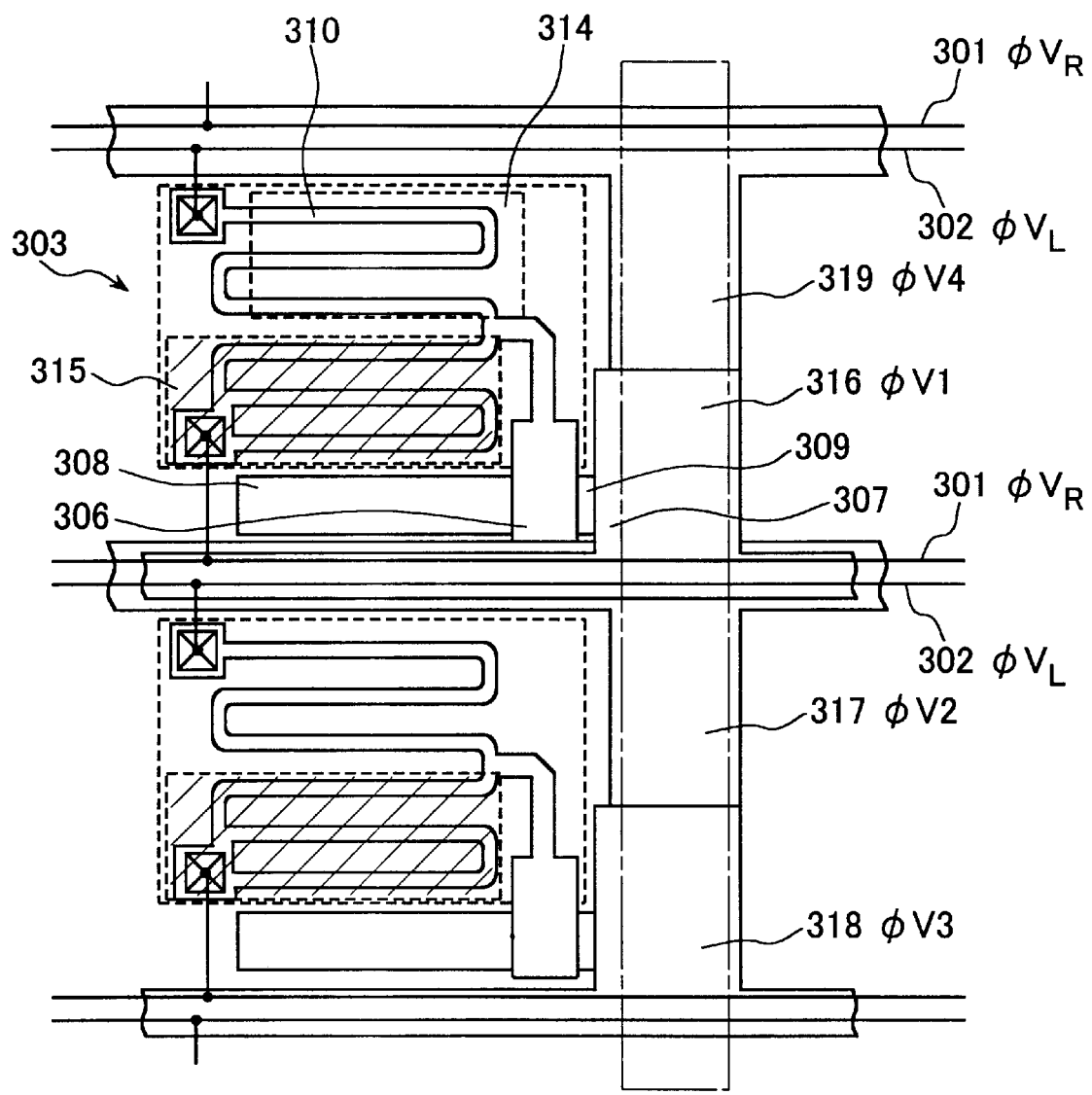
FIG. 13 is a partially enlarged view of the solid-state image pickup device shown in FIG. 12.
Figure 14:
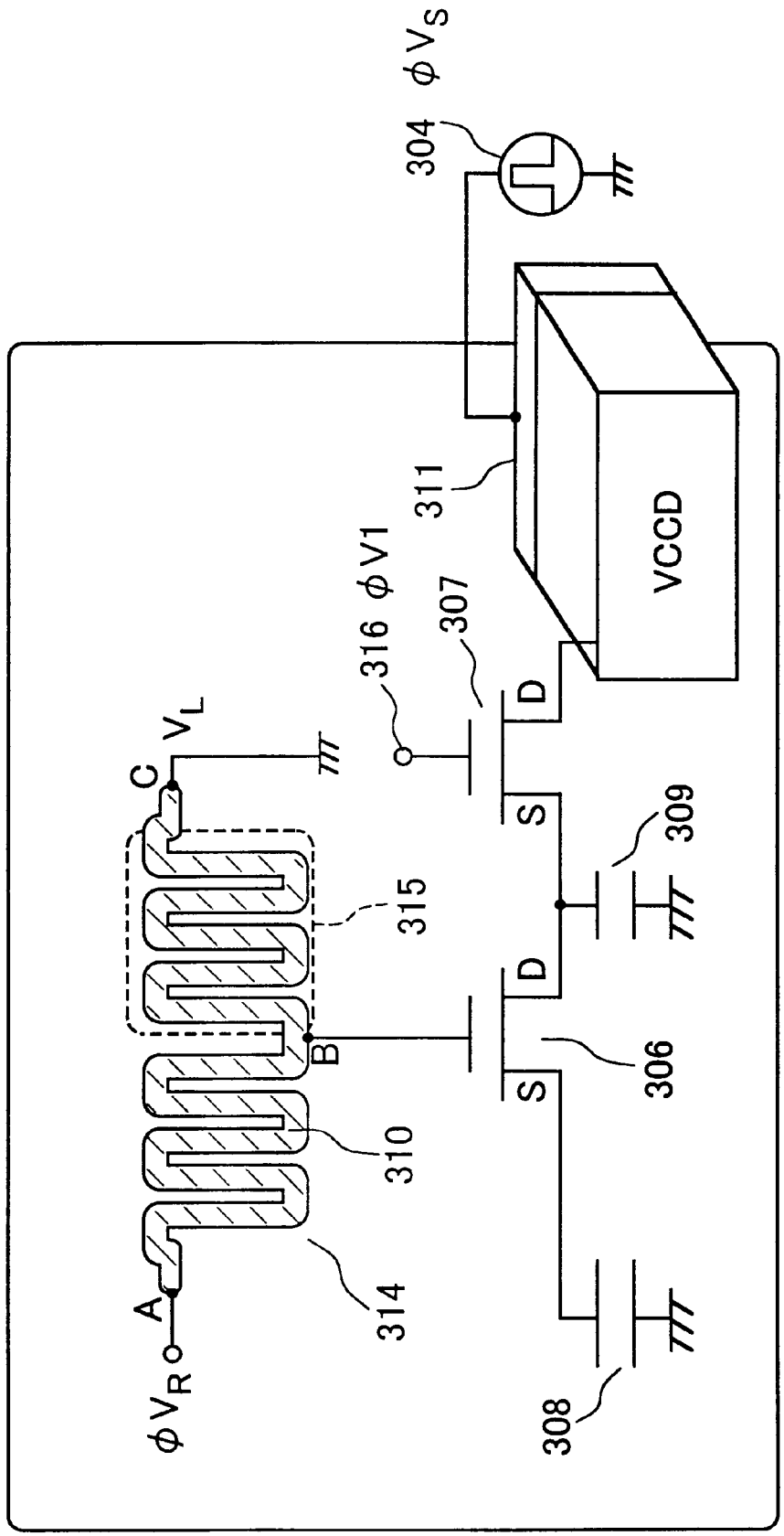
FIG. 14 shows an equivalent circuit of the solid-state image pickup device shown in FIG. 12.
Figure 15:
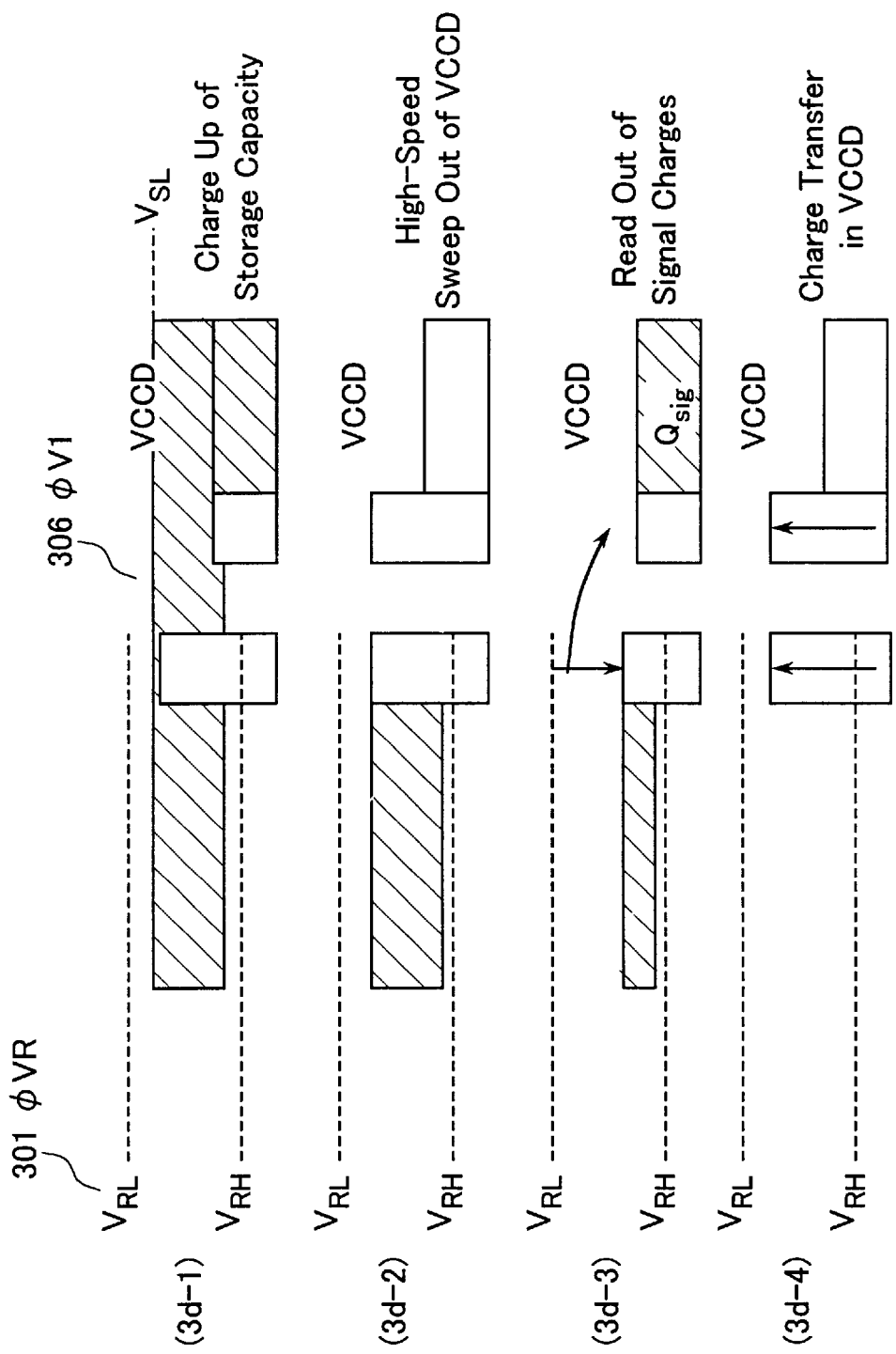
FIG. 15 illustrates changes in potential in the solid-state image pickup device shown in FIG. 12.

FIGS. 10 and 11 show another configuration of the above-mentioned solid-state image pickup device. In this solid-state image pickup device, heat detecting pixels 200 and light detecting pixels 210 are arranged alternately in the vertical direction. Also in this solid-state image pickup device, a heat insulating layer 201 including closed cavities 202 is arranged under each heat sensor (infrared ray sensor) 203. An electric signal from each pixel is read out to the outside via the signal vertical transmission means 204, the signal horizontal transmission means 205, and an output amplifier 206 in this order. As a light sensor (visible light sensor), a photodiode formed in the silicon substrate can be used. This solid-state image pickup device serves as an image forming device having a photoelectric conversion function in addition to a thermoelectric conversion function. Further, the solid-state image pickup device has a structure suitable for securing an area for the photodiodes, i.e., for securing sensitivity because it can achieve the reduced sizing of the heat sensor by utilizing the above-mentioned heat insulating layer.

With reference to FIGS. 12 to 16, the structure of a heat sensor and a signal output from this heat sensor will be more specifically described. In the present embodiment, a bolometer material is used as an infrared ray detecting material, and a CCV (VCCD) is used as a signal vertical transmission means.

To each pixel 303 including a heat sensor, $\Phi V_R$301 for providing a clock and $V_L$ (e.g., GND) 302 for providing a reference potential are supplied. As shown in a timing chart (FIG. 16) and a potential diagram (FIG. 15), first, charges are injected from a ($\Phi V_S$ terminal 304 connected to an n-type diffusion area 311 provided in the end of VCCD during a period (3d-1). At this time, for example, a voltage of 15 V is applied to $\Phi V_1$ 316 to bring a read-out gate 307 to an ON state so that a storage capacity portion 308 is filled with charges. A voltage applied to $\Phi V_S$ 304 is 15 V, for example.

During a period (3d-2), the read-out gate 307 is brought to an OFF state and the VCCD is swept out at high-speed. Subsequently, during a period (3d-3), signals are read out from the pixels. The read out of the signals from the pixels is achieved by reading out charges Qsig in accordance with a gate voltage of a detecting amplifier from the storage capacity portion 308. During a period (3d-4), signal charges are transferred by applying a predetermined voltage pulse to $\Phi V_1$316, $\Phi V_2$317, $\Phi V_3$318, and $\Phi V_4$319.

It is to be noted here that a capacity 309 between gates referes to a capacity formed between a drain of the detecting amplifier 306 and the read-out gate 307.

A heat sensor 310 using a bolometer material is formed across two areas, i.e., an infrared ray irradiation area 314 (from the point A to the point B) and an infrared ray cutoff area 315 (from the point B to the point C). A potential $V_G$ taken out from the point B, which is in the vicinity of the boundary between these two areas, is represented by Equation (1) below.

$$V_G=(R_1/(R_1+R_2))V_{RH} \quad (1)$$

Figure 16:
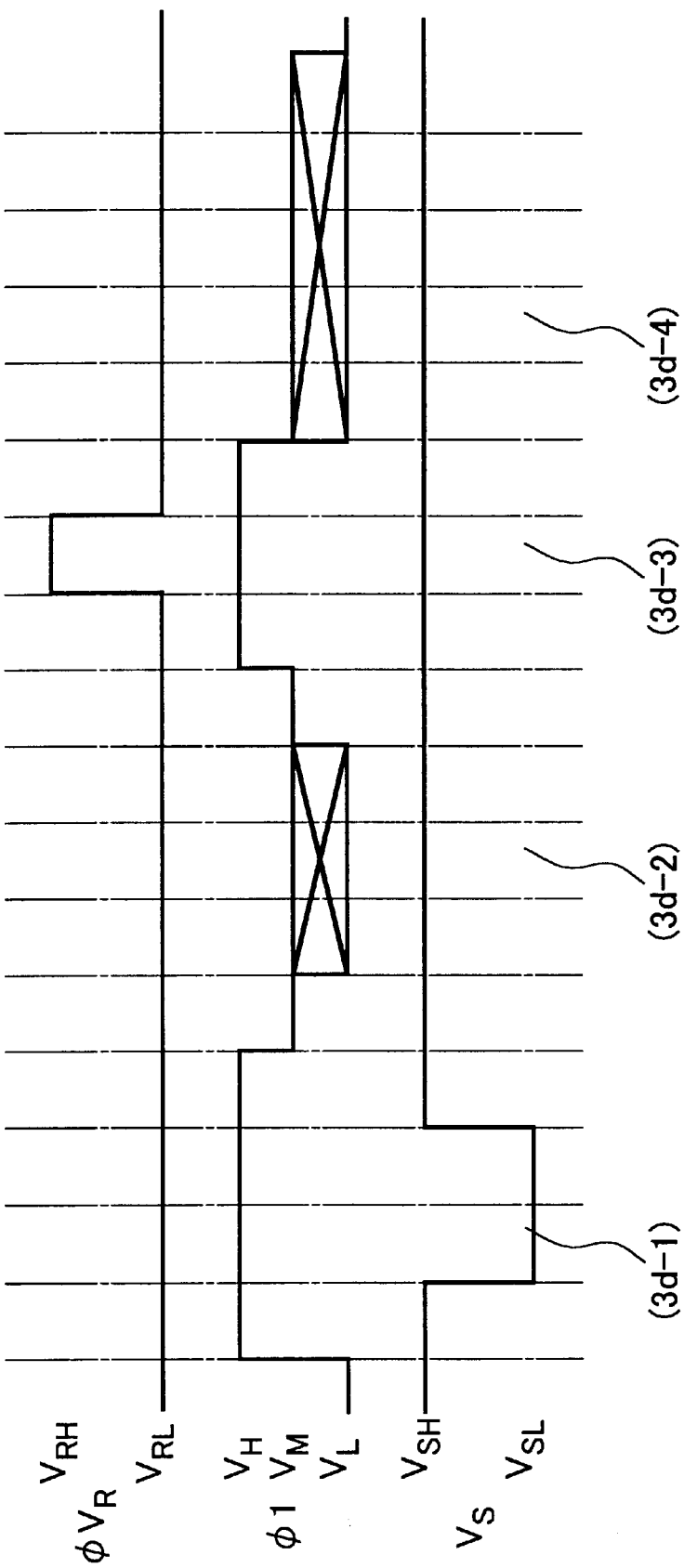
FIG. 16 shows a timing chart used for driving the solid-state image pickup device shown in FIG. 12.
Figure 17:
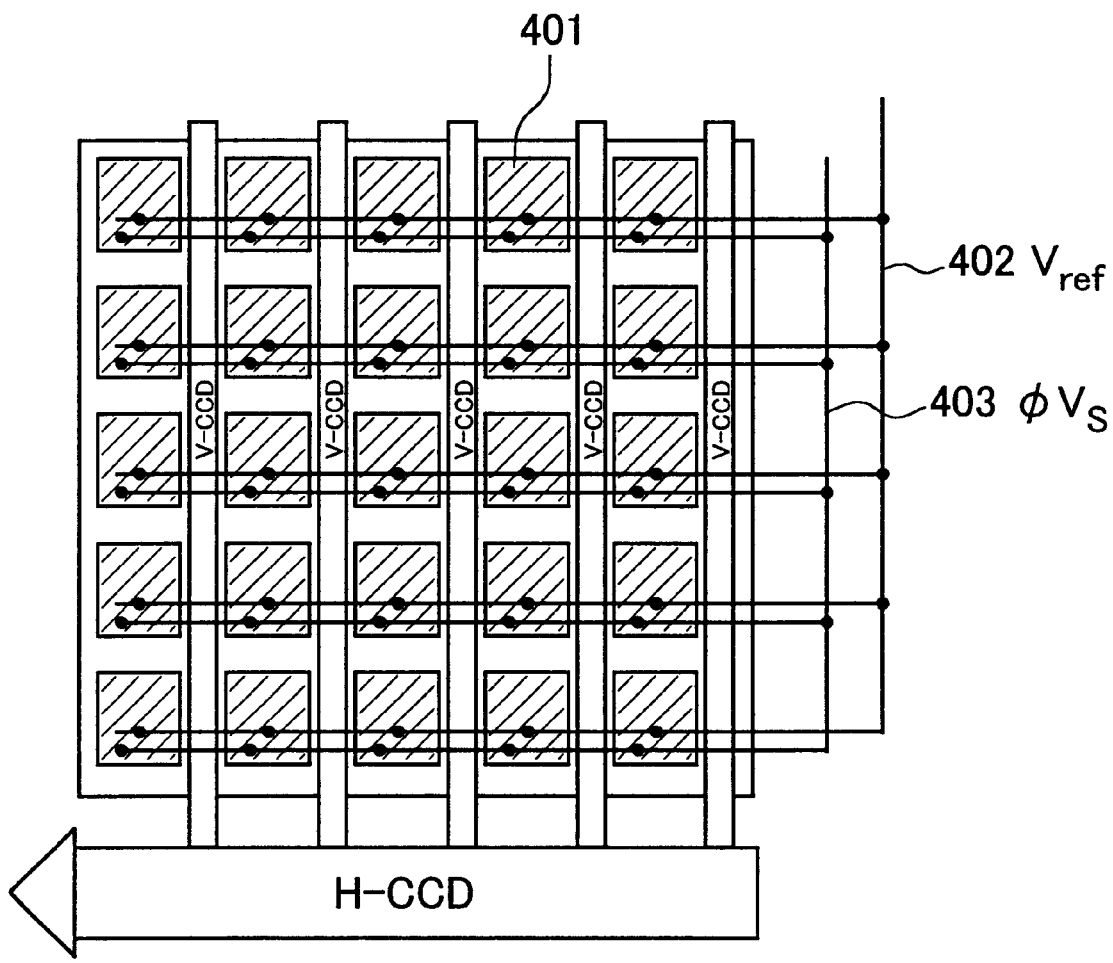
FIG. 17 is a plan view showing still another example of a solid-state image pickup device adopting the present invention.
Figure 18:
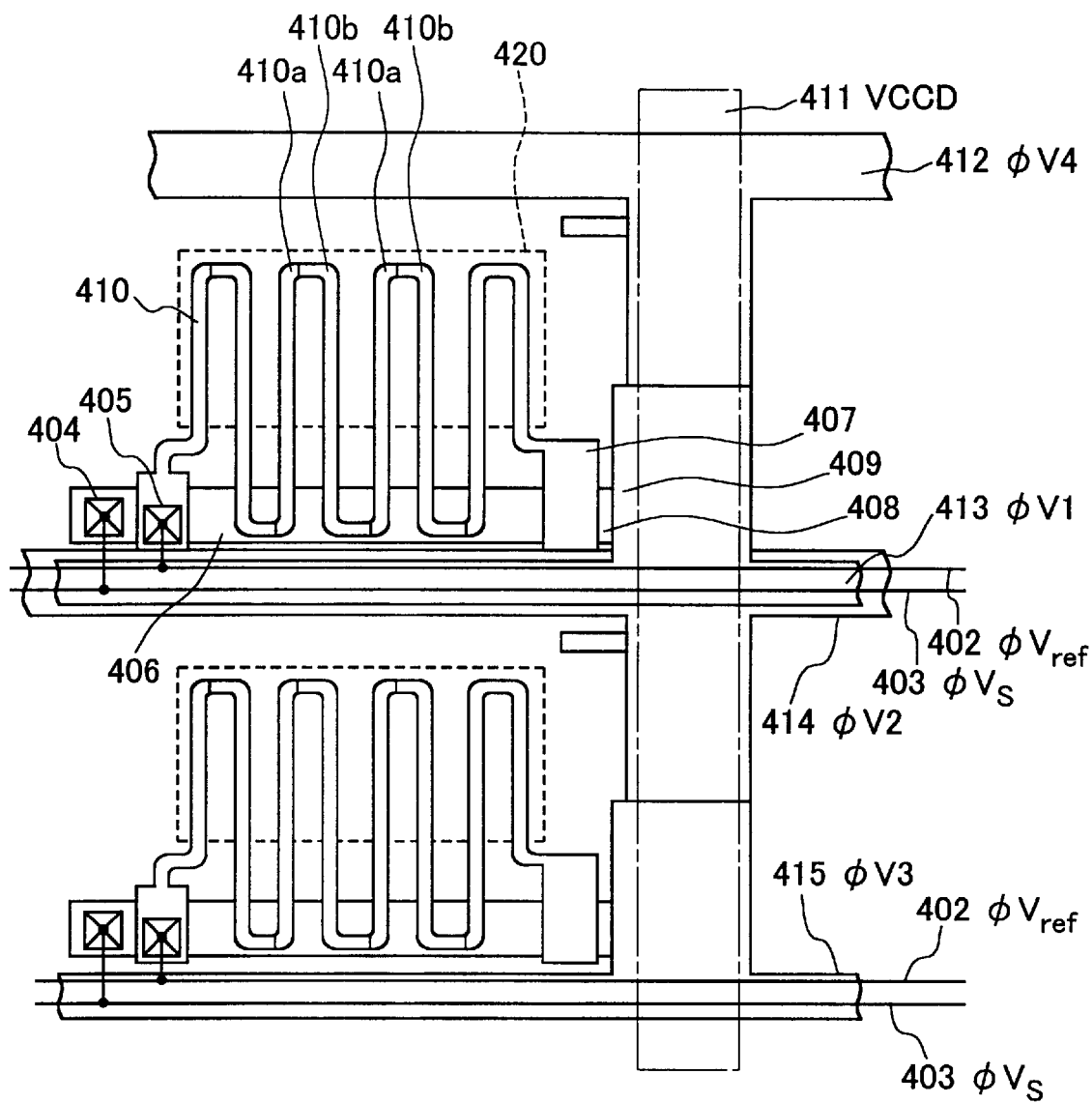
FIG. 18 is a partially enlarged view of the solid-state image pickup device shown in FIG. 17.
Figure 19:
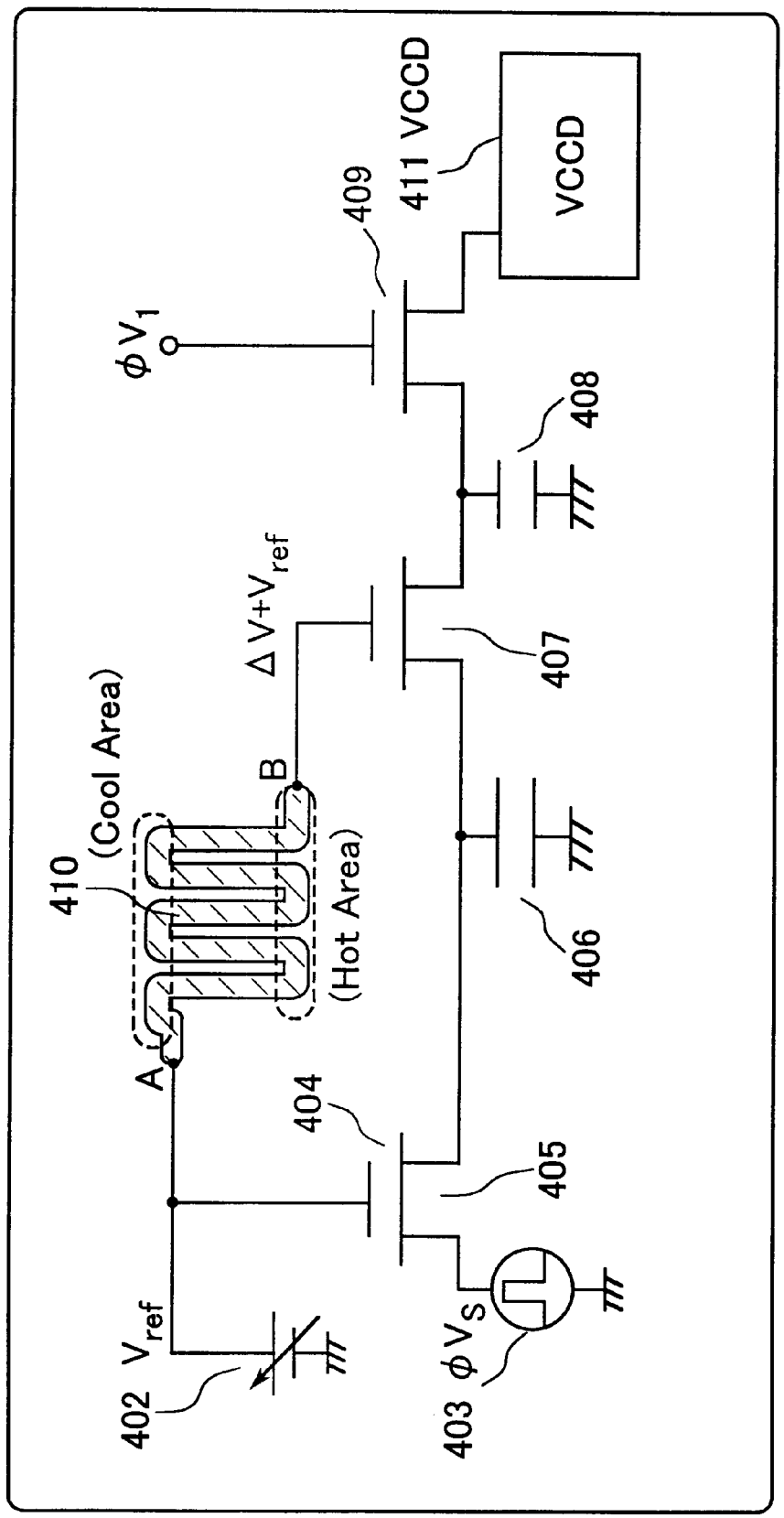
FIG. 19 shows an equivalent circuit of the solid-state image pickup device shown in FIG. 17.
Figure 20:
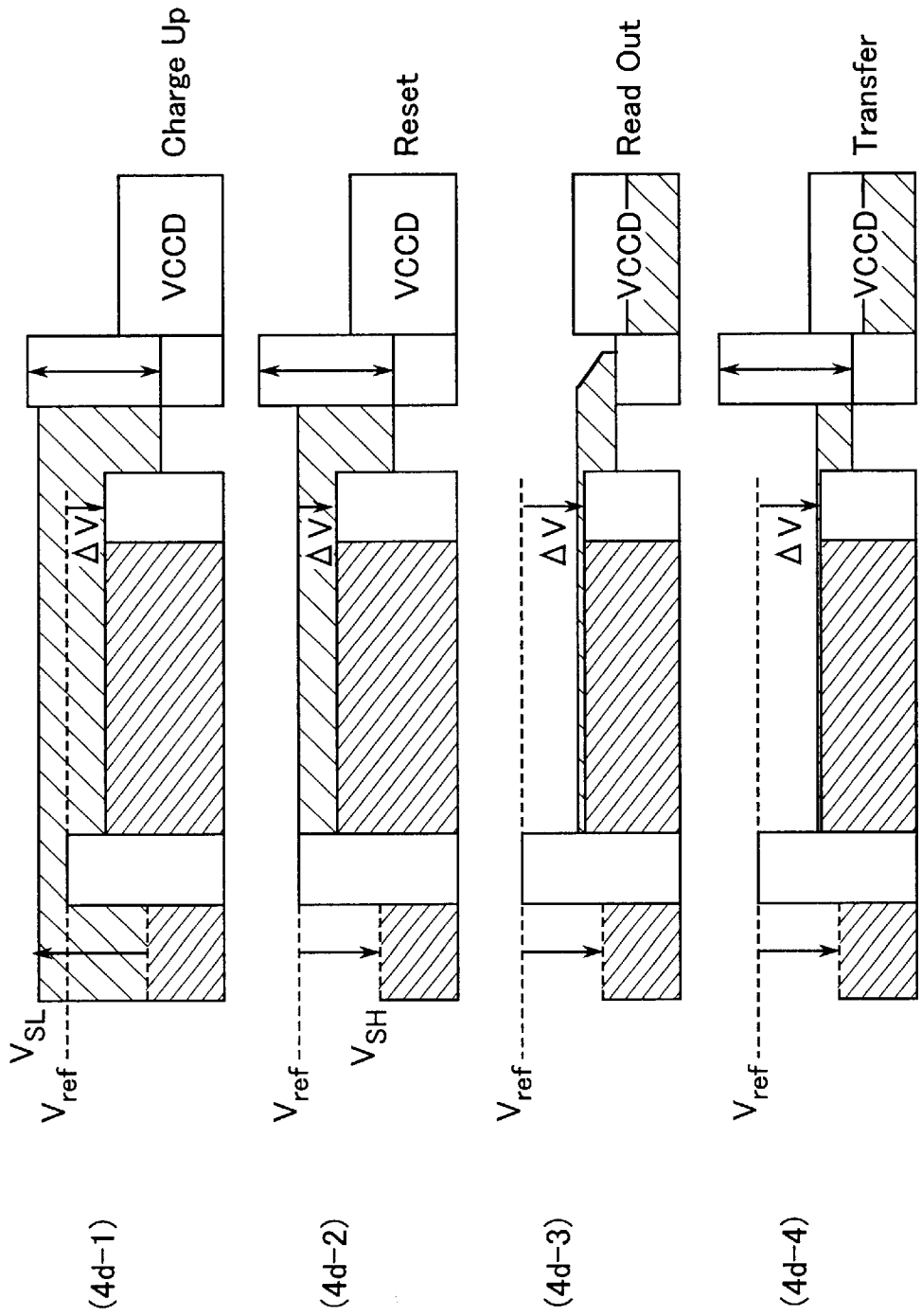
FIG. 20 illustrates changes in potential in the solid-state image pickup device shown in FIG. 17.

In Equation (1), $V_{RH}$ is a pulse voltage applied to $\Phi V_R$ shown in FIG. 16, and $R_1$ and $R_2$ are values of resistance in the infrared ray irradiation area and the infrared ray cutoff area, respectively. $R_1$ and $R_2$ can be represented by Equations (2) and (3) below, respectively.

$$R_1=R_{1(300K)}(1+\alpha(T_1-300K)) \quad (2)$$

$$R_2=R_{2(300K)}(1+\alpha(T_2-300K)) \quad (3)$$

In Equations (2) and (3), $R_{1(300K)}$ and $R_{2(300K)}$ are values of resistance of $R_1$ and $R_2$ at a temperature of 300K, respectively; $T_1$ and $T_2$ are temperatures of resistance $R_1$ and $R_2$, respectively; and α is TCR (Temperature Coefficient of Resistance).

For improving sensitivity of the heat sensor, it is desirable that the sensor is formed using a material with a high value of α and that the sensor has a structure capable of easily producing a difference between $T_1$ and $T_2$ when being irradiated with infrared rays. This heat sensor is advantageous in obtaining high sensitivity because it has a structure allowing a temperature difference to be easily maintained by the heat insulating layers including closed cavities.

Further, since the above-mentioned heat insulating layers can be formed without a large extra area, an area for arranging the storage capacity portion 308 for storing charges can be easily secured in each pixel in the solid-state image pickup device, as described above. If the heat sensor is configured so as to read out charges stored in the storage capacity portion 308, the sensor is less susceptible to influences of noise from a power supply and voltage variation and thus can be operated stably. The larger the capacity of the storage capacity portion, the more easily the high sensitivity is obtained. On this account, the above-mentioned solid-state image pickup device capable of eliminating a wasteful area used only for forming the heat insulating layers is advantageous.

Examples of the voltages in the timing chart shown in FIG. 16 are as follows:

Voltage applied to the heat sensor: $V_{RH}$=20 V, $V_{RL}$=5 V

Voltage applied to the VCCD: $V_H$=15 V, $V_M$=0 V, $V_L$=−7 V

Voltage applied to a source at the end of the VCCD: $V_{SH}$=15 V, $V_{SL}$=3 V.

Another configuration of the solid-state image pickup device will be described with reference to FIGS. 17 to 21.

In this solid-state image pickup device, a Seebeck material is used for forming a heat sensor. Also in this configuration, a CCD (VCCD) is used as a signal vertical transmission means. Further, a thermopile 410 including a plurality of n-type polycrystalline silicons 410a and n-type polycrystalline silicons 410b (e.g., at least two, respectively) arranged in series alternately is used as the heat sensor.

A reference voltage Vref 402 and a source voltage 403 are supplied to each heat detecting pixel 401 forming a unit pixel. As shown in a timing chart (FIG. 21) and a potential diagram (FIG. 20), first, during a period (4d-1), a potential $\Phi V_S$ at a source electrode 404 is set to $\Phi V_{SL}$ and charges are injected to a storage capacity portion 406 via a channel under a reference gate 405.

Next, during a period (4d-2), the potential $\Phi V_S$ at the source electrode 404 is increased to $\Phi V_{SH}$ and a surface potential of the storage capacity portion 406 is adjusted so as to coincide with a potential of the channel under the reference gate. During a period (4d-3), a potential $\Phi V_1$ is $\Phi V_H$, and a read-out gate 409 is brought to an ON state. While the gate is in the ON state, the charges stored in the storage capacity portion 406 are read out to VCCD in accordance with the potential variation ΔV due to a Seebeck effect and turned to signal charges Qsig. Subsequently, during a period (4d-4), signal charges are transferred by applying a predetermined voltage pulse to $\Phi V_1$ 413, $\Phi V_2$ 414, $\Phi V_3$ 415, and $\Phi V_4$ 412.

In the thermopile 410, p-n junctions present in an infrared ray irradiation area and p-n junctions present in an infrared ray cutoff area are provided successively by turns. In this sensor, the ΔV generated between the point A and point B can be represented by Equation (4) below.

$$\Delta V = N \cdot \alpha \cdot \Delta T \quad (4)$$

In Equation (4), N is the number of stages of the p-n junctions; a is a Seebeck coefficient; and ΔT is a temperature change in the sensor portion.

Figure 21:
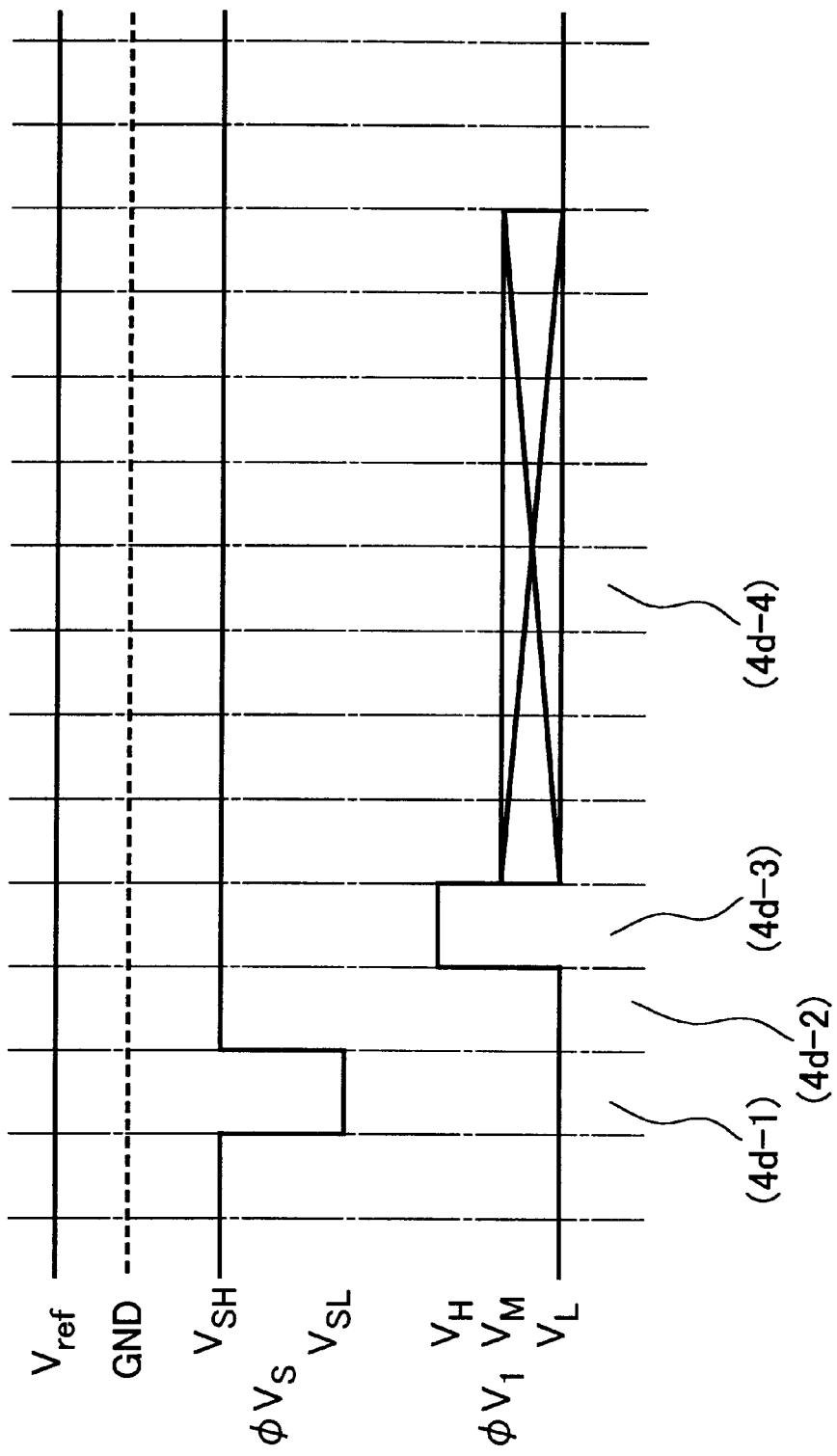
FIG. 21 shows a timing chart used for driving the solid-state image pickup device shown in FIG. 17.

A voltage applied to the point A in the thermopile shown in the timing chart of FIG. 21 is, for example, as follows:

$V_{SL}$=2.5 V, $V_{SH}$=4.0 V, and Vref=3.0 V.

Figure 22:
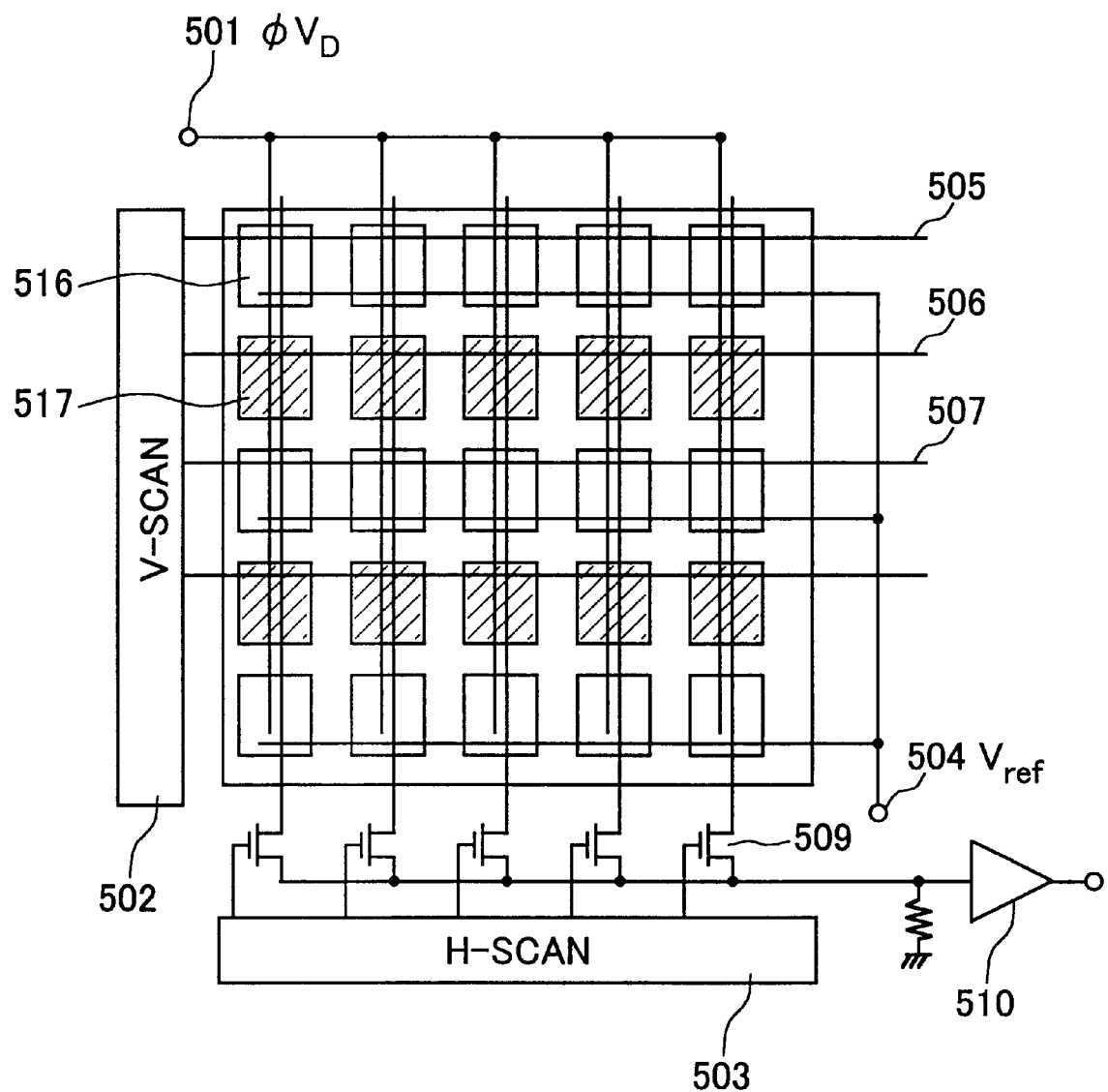
FIG. 22 is a plan view showing still another example of a solid-state image pickup device adopting the present invention.
Figure 23:
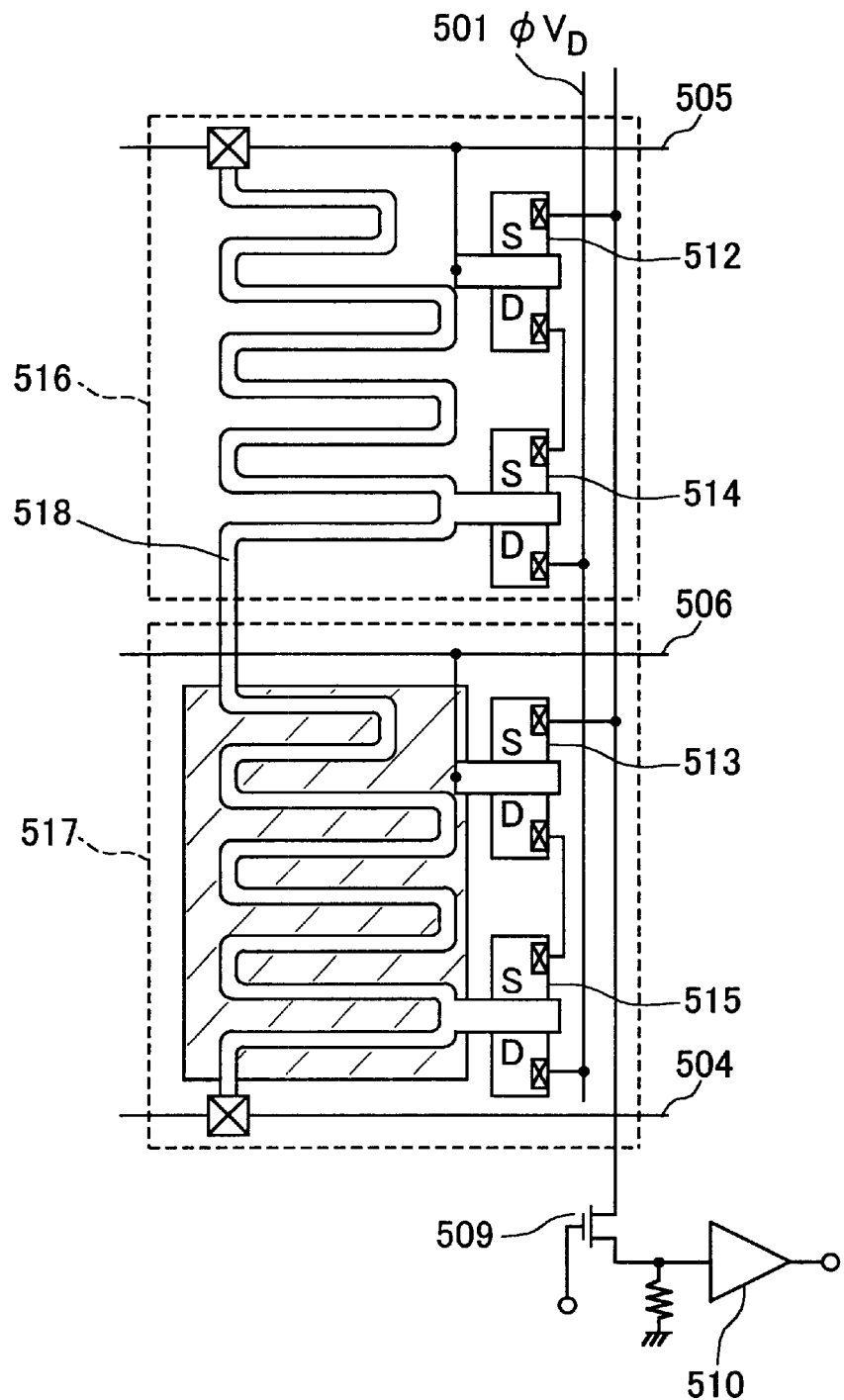
FIG. 23 is a partially enlarged view of the solid-state image pickup device shown in FIG. 22.

Still another configuration of the solid-state image pickup device will be described with reference to FIGS. 22 to 24.

In this solid-state image pickup device, C-MOS is used for reading out signals and a bolometer material is used for each pixel.

In this solid-state image pickup device, rows of infrared ray irradiation pixels 516 and rows of infrared ray insulating pixels 517 are arranged alternately in the vertical (column) direction. Also in this solid-state image pickup device, the infrared ray insulating pixels are covered with a shielding film formed of tungsten silicide or the like. A heat sensor 518 is formed across the infrared ray irradiation pixel 516 and infrared ray insulating pixel 517 adjacent thereto. From this pair of pixels 516 and 517, signals in accordance with gate potentials of detector FETs 514 and 515, which are determined depending on an amount of infrared rays radiated to these pixels, are read out to the outside. Further, $\Phi V_D$ 501 and a reference potential Vref 504 are supplied to this pair of pixels.

To the nth row, the (n+1)th row, the (n+2)th row, . . . of the pixels, the nth selection line 505, the (n+1)th selection line 506, the (n+2)th selection line 507, . . . are respectively connected. Each selection line selects the corresponding pixel row by applying a voltage $\Phi$Vsel from a vertical shift register (V-SCAN) 502 to the gates of selector FETs 512 and 513 to bring the FET to an ON state. In this state, respective signal outputs obtained from predetermined pixel rows by FETs (FET-SW) 509 arranged in respective pixel rows are read out sequentially by a horizontal transfer register (H-SCAN) 503 via an output amplifier 510.

Figure 24:
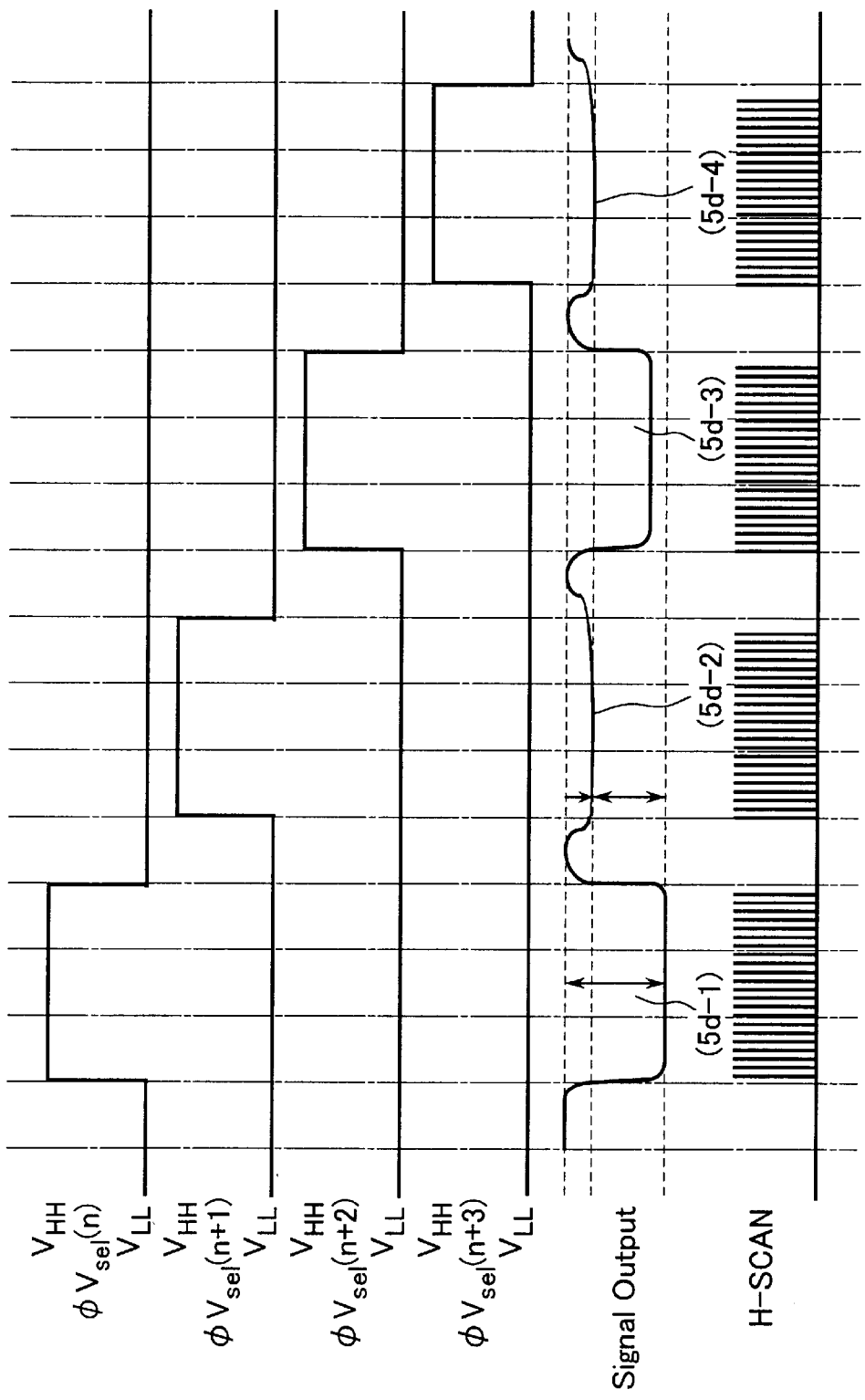
FIG. 24 shows a timing chart, along with a signal output, used for driving the solid-state image pickup device shown in FIG. 22.
Figure 25:
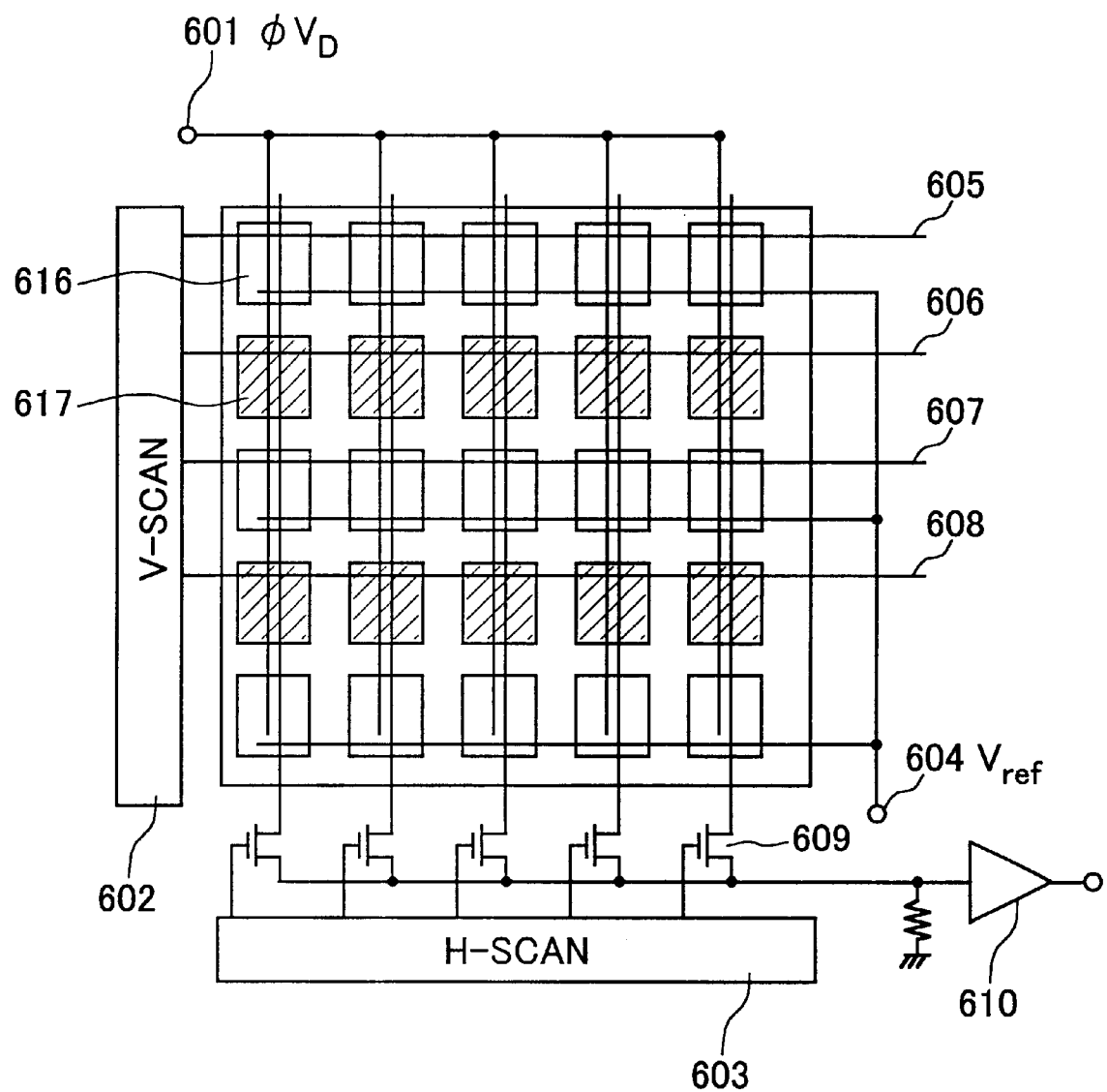
FIG. 25 is a plan view showing still another example of a solid-state image pickup device adopting the present invention.
Figure 26:
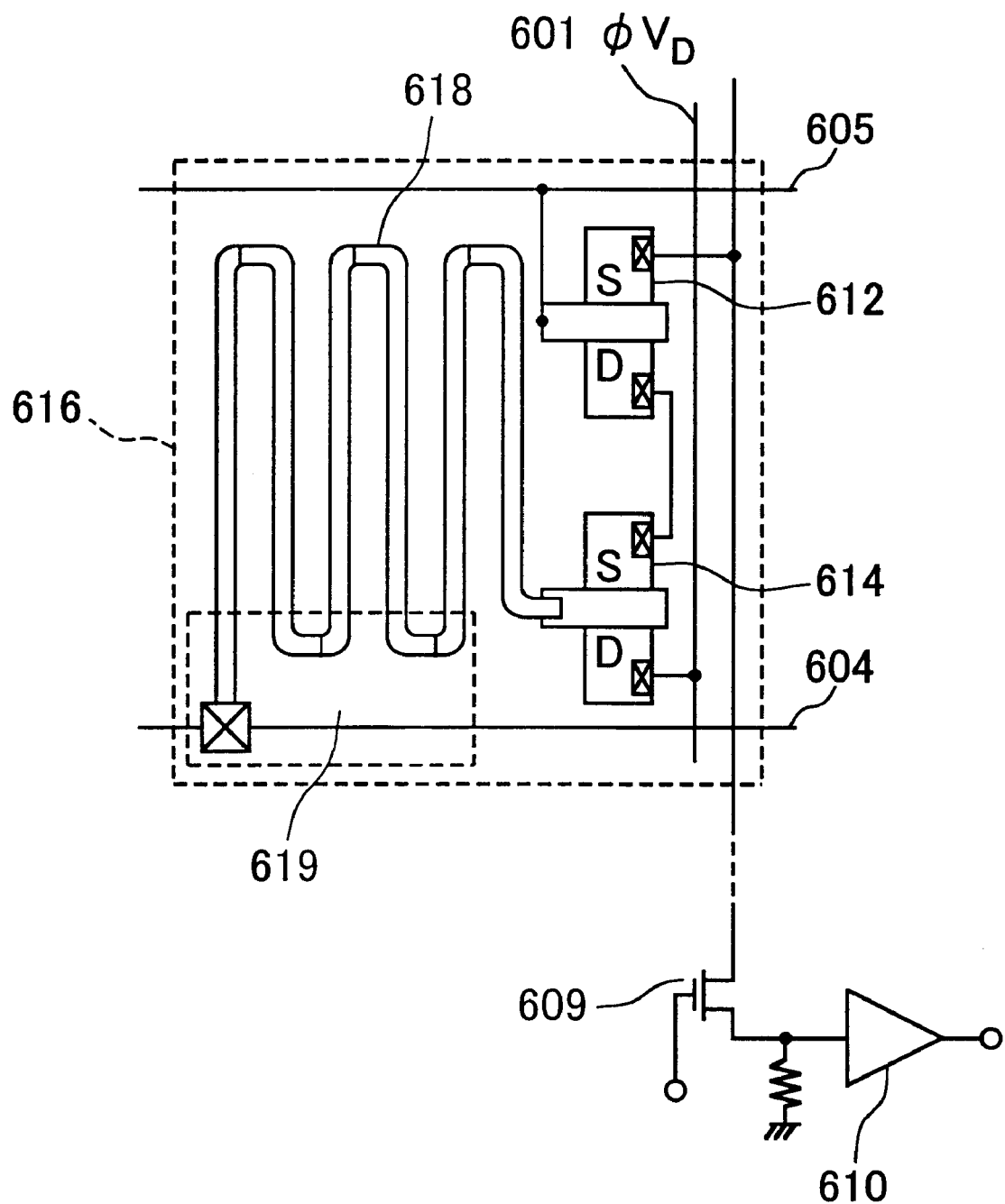
FIG. 26 is a partially enlarged view of the solid-state image pickup device shown in FIG. 25.
Figure 27:
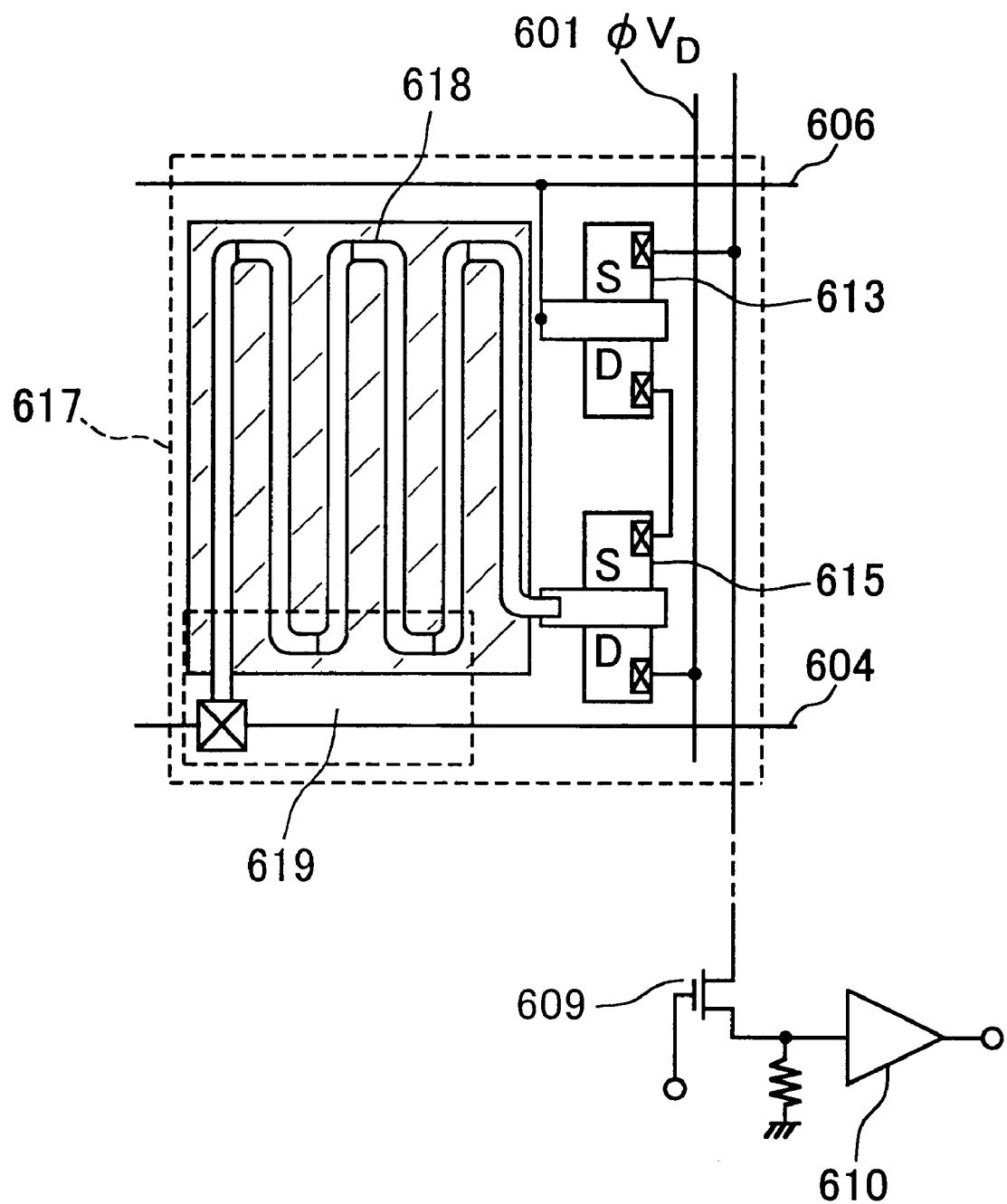
FIG. 27 is a partially enlarged view of the solid-state image pickup device shown in FIG. 25.
Figure 28:
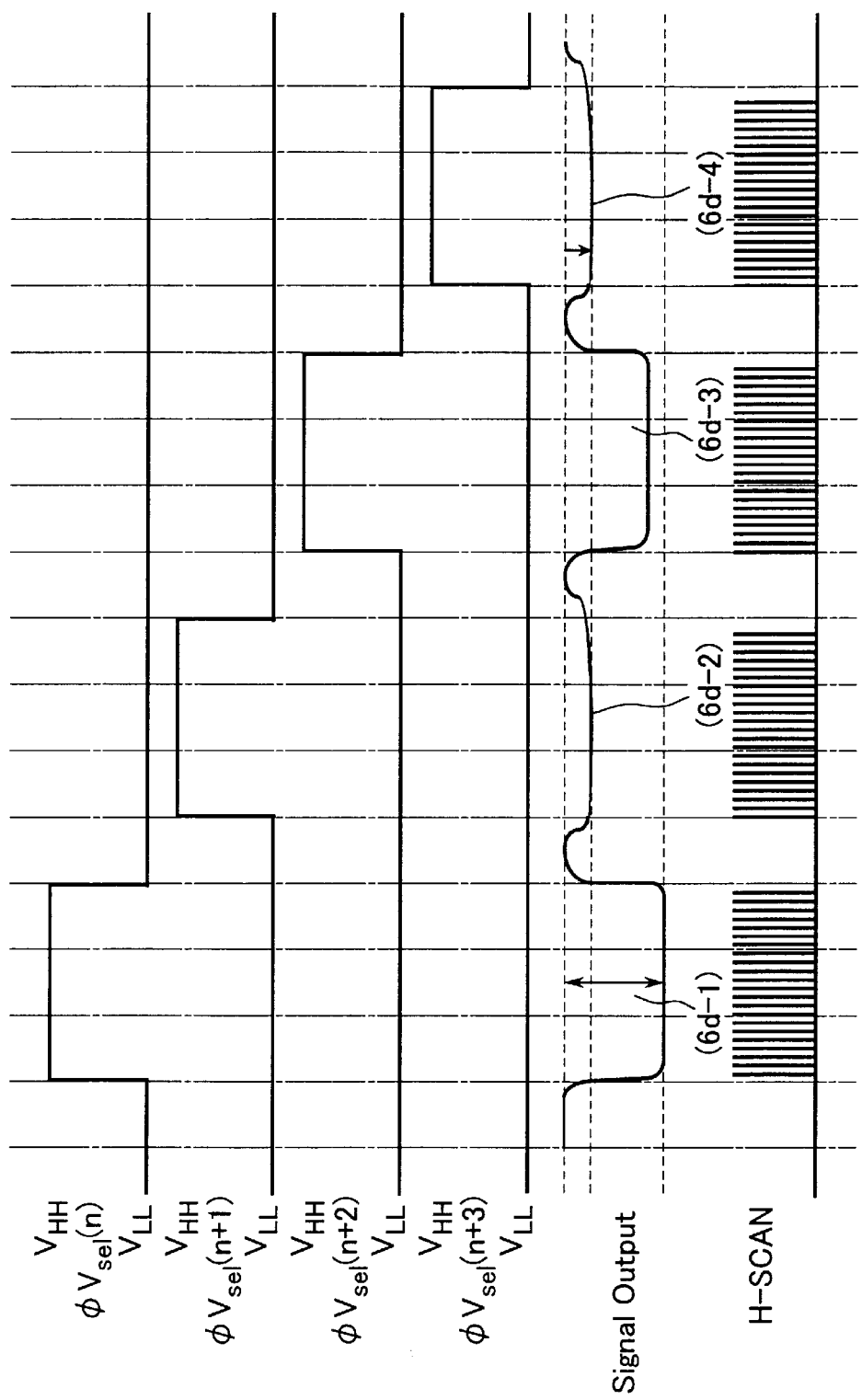
FIG. 28 shows a timing chart, along with a signal output, used for driving the solid-state image pickup device shown in FIG. 25.

An example of a pattern of a voltage pulse applied to the respective selection lines and a resultant signal output is shown in FIG. 24. A signal output is obtained from a group of the infrared ray irradiation pixels during periods (5d-1) and (5d-3) whereas a signal output is obtained from a group of the infrared ray insulating pixels during periods (5d-2) and (5d-4). Also in this solid-state image pickup device, the changes in potential due to the bolometer material as shown in Equations (1) to (3) are basically utilized.

Still another configuration of the solid-state image pickup device will be described with reference to FIGS. 25 to 28.

In this solid-state image pickup device, C-MOS is used for reading out signals and a bolometer material is used for each pixel.

In this solid-state image pickup device, rows of infrared ray irradiation pixels 616 and rows of infrared ray insulating pixels 617 are arranged alternately in the vertical (column) direction. Also in this solid-state image pickup device, the infrared ray insulating pixels are covered with a shielding film formed of tungsten silicide or the like. In a heat sensor 618, n-type polycrystalline silicon and n-type polycrystalline silicon are arranged in series alternately, and p-n junctions are arranged in a cool area 619 by turns. A heat insulating layer is not provided under this cool area 619. Therefore, heat radiation to the substrate occurs relatively rapidly. From this pair of pixels 616 and 617, signals in accordance with gate potentials of detector FETs 614 and 615, which are determined depending on an amount of infrared rays radiated to these pixels, are read out to the outside. Further, $\Phi V_D$ 601 and a reference potential Vref 604 are supplied to the respective pixels.

To the nth row, the (n+1)th row, the (n+2)th row, . . . of the pixels, the nth selection line 605, the (n+1)th selection line 606, the (n+2)th selection line 607, . . . are respectively connected. Each selection line selects the corresponding pixel row by applying a voltage $\Phi$Vsel from a vertical shift register (V-SCAN) 602 to the gates of selector FETs 612 and 613 to bring the FET to an ON state. In this state, respective signal outputs obtained from predetermined pixel rows by FETs (FET-SW) 609 arranged in respective pixel rows are read out sequentially by a horizontal transfer register (H-SCAN) 603 via an output amplifier 610.

An example of a pattern of a voltage pulse applied to the respective selection lines and a resultant signal output is shown in FIG. 24. A signal output is obtained from a group of the infrared ray irradiation pixels during periods (6d-1) and (6d-3) whereas a signal output is obtained from a group of the infrared ray insulating pixels during periods (6d-2) and (6d-4). Also in this solid-state image pickup device, the changes in potential due to the bolometer material as shown in Equation (4) are basically utilized.

As described above, the present invention can provide a semiconductor device allowing a high-density arrangement of heat detecting portions. Moreover, this semiconductor device can be manufactured by a method that is highly compatible with a silicon mass production process. A semiconductor device according to the present invention can be utilized as a solid-state image pickup element capable of treating various light, for example, from infrared light to visible light.

The present invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device, comprising:

a silicon substrate;

a heat insulating layer including a silicon oxide film, which is formed on the silicon substrate; and a heat detecting portion formed on the heat insulating layer, wherein the heat insulating layer includes a plurality of closed cavities or holes provided for the heat detecting portion, an interior of the holes has a greater diameter than an opening of the holes, and at least a portion of the closed cavities or holes is formed within the silicon oxide film.

2. The semiconductor device according to claim 1, wherein the heat insulating layer includes the plurality of closed cavities.

3. The semiconductor device according to claim 2, wherein the heat insulating layer includes at least one of a partially oxidized silicon polycrystalline film and an additional silicon oxide film above the plurality of closed cavities.

4. The semiconductor device according to claim 1, wherein the heat insulating layer includes the plurality of holes and at least one of a partially oxidized silicon polycrystalline film and an additional silicon oxide film, the opening of each of the plurality of holes being surrounded by at least one of an oxidized portion of the partially oxidized silicon polycrystalline film and the additional silicon oxide film.

5. The semiconductor device according to claim 1, wherein the heat insulating layer includes a silicon nitride film formed on the silicon oxide film.

6. The semiconductor device according to claim 5, wherein the heat insulating layer includes the plurality of closed cavities and the silicon nitride film includes an opening above the plurality of closed cavities.

7. The semiconductor device according to claim 5, wherein the plurality of holes are included in the heat insulating layer and the opening of each of the plurality of holes extends through the silicon nitride film.

8. The semiconductor device according to claim 5, wherein at least one of a partially oxidized silicon polycrystalline film and an additional silicon oxide film is formed on the silicon nitride film.

9. The semiconductor device according to claim 1 further comprising an intermediate layer between the heat insulating layer and the heat detecting portion, wherein the intermediate layer is formed of at least one selected from an organic material and a porous material.

10. The semiconductor device according to claim 1, wherein the heat detecting portion is formed of a material with at least one selected from a bolometer effect and a Seebeck effect.

11. The semiconductor device according to claim 1, wherein a diameter of each of the plurality of closed cavities or holes at a portion within the silicon oxide film is between 10 nm and 1 $\mu$m in a thickness direction of the heat insulating layer.

12. The semiconductor device according to claim 1, wherein a diameter of each of the plurality of closed cavities or holes at a portion within the silicon oxide film is between 0.3 $\mu$m and 0.8 $\mu$m in an in-plane direction of the heat insulating layer.

13. The semiconductor device according to claim 1, wherein the heat detecting portion has a strip shape and is bent back and forth along a predetermined direction.

14. The semiconductor device according to claim 1, wherein the plurality of closed cavities or holes are linked with each other in the heat insulating layer.

15. The semiconductor device according to claim 1, wherein the plurality of closed cavities or holes are arranged in a predetermined pattern, and the heat detecting portion is formed along this pattern.

16. The semiconductor device according to claim 1, wherein a plurality of heat insulating layers and heat detecting portions are arranged in rows and columns on the silicon substrate.

17. The semiconductor device according to claim 16 further comprising a plurality of light detecting portions, wherein each of the light detecting portions is arranged adjacent to each of the heat detecting portions.

18. The semiconductor device according to claim 16 further comprising a charge coupled device as a signal vertical transmission means for transmitting signals along the columns of the heat detecting portions.

19. The semiconductor device according to claim 16 further comprising a read-out structure using a complementary MOS as a signal vertical transmission means for transmitting signals along the columns of the heat detecting portions.

20. The semiconductor device according to claim 16 further comprising:

a plurality of charge storage portions; and a plurality of charge read-out portions for reading out a charge from the charge storage portion in accordance with an electric signal generated in the heat detecting portion, wherein each of the charge storage portions and each of the charge read-out portions are provided with respect to each of the heat detecting portions.

21. The semiconductor device according to claim 1, wherein the semiconductor device comprises a pixel for thermoelectric conversion, and wherein the heat detecting portion substantially covers the pixel.

* * * * *

UNITED STATES PATENT AND TRADEMARK OFFICE
CERTIFICATE OF CORRECTION

PATENT NO. : 6,548,879 B2
DATED : April 15, 2003
INVENTOR(S) : Komobuchi et al.

It is certified that error appears in the above-identified patent and that said Letters Patent is hereby corrected as shown below:

<u>Title page,</u>
Item [73], Assignee, please add the following information:
-- [73] Assignee: Matsushita Electric Industrial Co., Ltd., Osaka, Japan --

Signed and Sealed this

Thirtieth Day of March, 2004

JON W. DUDAS
*Acting Director of the United States Patent and Trademark Office*